(12) United States Patent
Gray

(10) Patent No.: US 7,290,021 B2
(45) Date of Patent: Oct. 30, 2007

(54) METHOD AND APPARATUS FOR PARALLEL SIGNAL PROCESSING

(75) Inventor: Andrew A. Gray, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 289 days.

(21) Appl. No.: 10/132,085

(22) Filed: Apr. 24, 2002

(65) Prior Publication Data

US 2003/0005008 A1   Jan. 2, 2003

Related U.S. Application Data

(60) Provisional application No. 60/286,428, filed on Apr. 24, 2001, provisional application No. 60/305,423, filed on Jul. 13, 2001.

(51) Int. Cl.
*G06F 17/10* (2006.01)
(52) U.S. Cl. ........................ 708/300; 708/321
(58) Field of Classification Search ............... 708/300, 708/321
See application file for complete search history.

(56) References Cited

U.S. PATENT DOCUMENTS

| | | | |
|---|---|---|---|
| 4,623,980 A | 11/1986 | Vary | |
| 5,323,391 A * | 6/1994 | Harrison | 370/210 |
| 5,671,168 A * | 9/1997 | Liu et al. | 708/321 |
| 5,682,341 A | 10/1997 | Kim et al. | |
| 5,809,069 A * | 9/1998 | Polley et al. | 375/222 |
| 5,926,455 A | 7/1999 | Allpress | |
| 5,999,573 A | 12/1999 | Zangi | |
| 6,005,900 A | 12/1999 | Zangi | |
| 6,167,102 A | 12/2000 | Hellberg | |

* cited by examiner

*Primary Examiner*—Tan V. Mai
(74) *Attorney, Agent, or Firm*—J. D. Harriman, II; DLA Piper US LLP

(57) ABSTRACT

Disclosed is a method of providing signal processing operations, including convolution/filtering, where each parallel stream is processing signals at a lower rate than the signal data rate itself while still resulting in an overall signal processing rate suitable for high rate signal processing. This allows devices with a lower signal processing rate to be used in the parallel processing paths, avoiding many of the problems facing prior art high data rate signal processing. The invention converts a signal from the time domain to the frequency domain and takes advantage of associative and communicative properties of data processing to perform signal processing operations in parallel.

2 Claims, 23 Drawing Sheets

METHOD AND APPARATUS FOR PARALLEL SIGNAL PROCESSING

This application claims priority from provisional applications numbered 60/286,428 filed Apr. 24, 2001 and 60/305,423 filed Jul. 13, 2001.

BACKGROUND OF THE INVENTION

1. Field of the Invention

The present invention relates to the field of signal processing.

2. Background Art

Signal processing can be difficult when the signal is a high rate signal. High rate systems may require expensive and/or custom devices for appropriate processing functionality to process the signal at the rate required. Some prior art approaches to providing devices capable of high rate signal processing are described below.

One current solution is to use commercially available microprocessors to implement the desired signal processing functionality. However, for high signal rate applications, commercial microprocessors may not be able to provide the desired signal processing rate.

Another solution is to make custom ASIC (application specific integrated circuit) devices. Such devices are designed with a specific functionality in mind. ASIC's differ from general purpose microprocessors in that they are optimized for a specific task. Even with custom devices designed for a specific function, standard techniques of circuit fabrication may still be inadequate to provide the desired signal processing rate. Using standard CMOS (complementary metal-oxide-semiconductor) techniques, ASIC's capable of an adequate signal processing rate may still be challenging to produce.

When CMOS devices (either ASIC's or mircroprocessors) are unable to provide adequate signal processing performance, another prior art solution is to implement circuits using gallium arsenide (GaAs) technology. This technology results in higher clock speeds and consequently greater signal processing rates. However, GaAs technology is expensive to design and implement and also has lower yields than silicon based CMOS technology This results in still greater costs. Another problem is that the device density of GaAs devices is lower than that of CMOS processes. This means that physically larger GaAs devices must be used, leading to greater problems with design and power management.

SUMMARY OF THE INVENTION

The present invention is directed to a method of providing signal processing operations, including convolution/filtering, where each parallel stream is processing signals at a lower rate than the signal data rate itself while still resulting in an overall signal processing rate suitable for high rate signal processing. This allows devices with a lower signal processing rate to be used in the parallel processing paths, avoiding many of the problems facing prior art high data rate signal processing. The invention converts a signal from the time domain to the frequency domain and takes advantage of associative and communicative properties of data processing to perform signal processing operations in parallel.

DETAILED DESCRIPTION OF THE INVENTION

The present invention is a method and apparatus for providing parallel signal processing. In the following description, numerous specific details are set forth to provide a more thorough description of embodiments of the invention. It is apparent, however, to one skilled in the art, that the invention may be practiced without these specific details. In other instances, well known features have not been described in detail so as not to obscure the invention.

One type of operation in signal processing that is often required is a convolution operation where an input signal must be convolved with other values or signals to produce a desired output. An example of a common convolution operation is a filtering operation, such as in a finite impulse response (FIR) filter. The present invention can be implemented with many types of signal processing. For purposes of example, embodiments of the invention are described in conjunction with convolution operations and/or filtering operations.

Figure 1:
FIG. 1 is a diagram of a filtering operation of a data stream.

FIG. 1 illustrates at a functional level a filtering operation on an incoming data stream. The data source 101 is, for example, a 1 GHz data rate stream. The data stream is provided to a filter 102, also required to operate at a rate to provide 1 GHz sample output 103. Consider as an example that the filter 102 provides one output per time cycle. As above, there are a number of problems and disadvantages with prior art attempts to provide devices such as filter 102 that provide an adequate signal processing rate.

Figure 2:
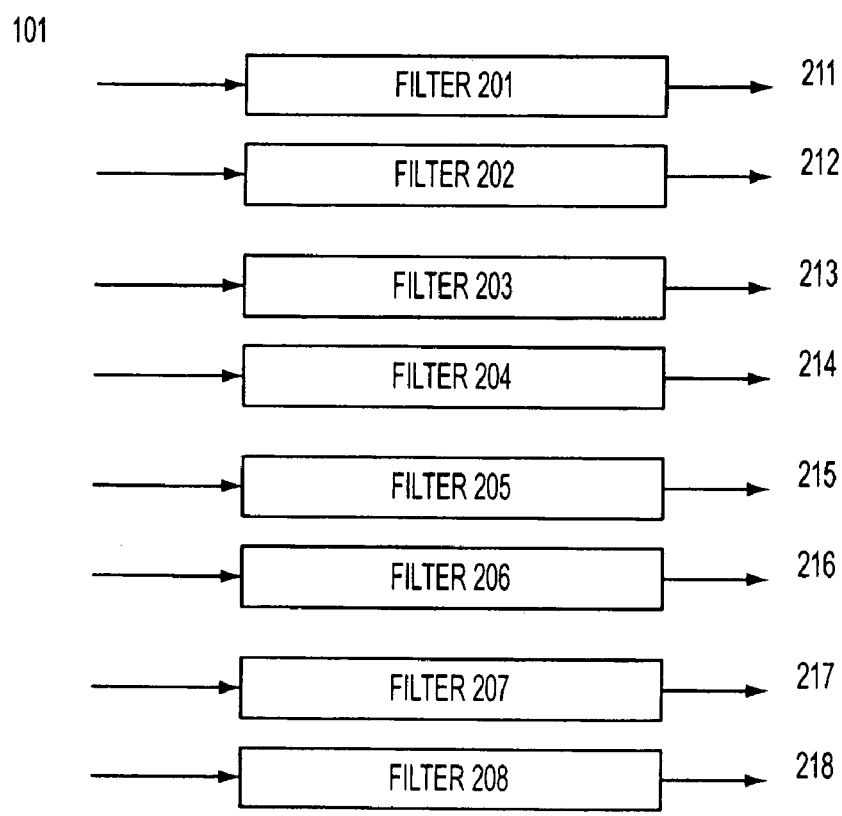
FIG. 2 is a block diagram of an embodiment of the invention.

One proposed solution to the requirement of a high signal processing rate is to implement a parallel processing architecture as illustrated in FIG. 2. The high speed data stream 101 is provided to each of a plurality of parallel subfilters 201-208 to provide outputs 211-218. For purposes of the example of FIG. 2, the data stream is split into eight parts for filtering by eight parallel subfilters, but the invention contemplates any number of parallel paths as required.

The subfilters 201-208 of FIG. 2 can each operate at approximately $\frac{1}{8}^{th}$ the signal processing rate of the filter 102 of FIG. 1. Each subfilter provides a different output based on how it is designed. For example, each subfilter provides an output after eight time cycles. Thus, after eight time cycles, the combined subfilters have provided eight outputs, matching the eight time cycle output of the filter 102 of FIG. 1. An advantage of the system of FIG. 2 is the fact that the parallel subfilters can be implemented using simpler technology, such as commercial microprocessors, or CMOS ASIC's.

In implementing the system of FIG. 2, one problem is how to divide the data stream so that operations on it can be parallelized. A first part of that question is the number of parallel streams required. If M is the rate of the data stream, and N is the signal processing rate of the subfilter, then M/N parallel subfilters are required. Thus, if each subfilter operates at, for example, $\frac{1}{8}^{th}$ or $\frac{1}{16}^{th}$ the incoming data rate, then 8 or 16 parallel subfilters would be required. One problem with providing, for example, eight multiple parallel subfilters is the fact that the device count, and correspondingly the gate count, is increased by a factor of eight. This gate and real estate penalty can be limiting depending on the application.

Another problem arises due to the fact that the data processing has "memory". In other words, the state of processing of one part of the data depends on prior processing operations.

In one embodiment of the present invention, a solution is provided that does not require an eightfold increase in gates to have eight parallel subfilter paths. In this embodiment, the data signal, which is in the time domain, is converted to the frequency domain for the filtering operation, and then back to the time domain for subsequent post filter processing.

When implementing, for example, and FIR filter, the filtering operation is a convolution operation. In other words, the input data stream is convolved with the coefficients of the filter. The present invention performs a parallel series of "subconvolutions" on the data stream which can then be combined to find the same result as if a traditional convolution had taken place.

A known way to convert information from the time domain to the frequency domain is through the use of fast Fourier transforms (FFT's). These FFT's provide a natural parallelization which can be taken advantage of in the present invention. In part this is because samples are processed in blocks instead of one at a time. This promotes the paralellization of the invention because the samples that comprise a block can be processed individually by parallel subfilters.

One embodiment of the invention provides architectures for parallel discrete-time convolution filters based on vector processing, subconvolution, and the discrete Fourier transform-inverse discrete Fourier transform (DFT-IDFT) overlap and save method. The result is a very large scale integration (VLSI) parallel processing architecture for high order filtering/correlation so that high rate systems can be processed with lower rate hardware, and with relatively low complexity (low transistor count) devices.

Typically, the order of the filter has been tied to the length of the FFT. For example, to implement a 128 tap filter has required an FFT that is capable of taking at least 128 samples at a time. Implementing a 128 point FFT concurrent processing requires a large number of gates.

The present invention provides a solution for the above problem by decoupling the size of the filter from the size of the FFT. The parallel method presented in this embodiment allows relatively small DFT-IDFT pairs, while the order of the finite impulse response (FIR) filter tap length is theoretically unlimited. The size of the DFT-IDFT pair is determined by the processing rate reduction desired, and is independent of the order of the filter to be implemented.

Figure 3:
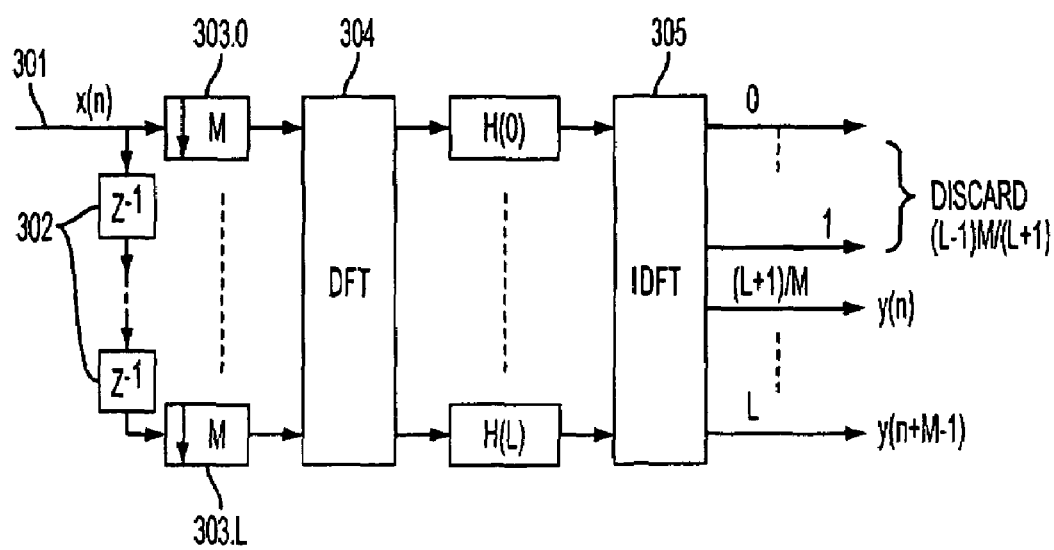
FIG. 3 is a block diagram of a parallel filtering environment.

FIG. 3 illustrates a parallel DFT-IDFT filtering architecture for frequency domain filtering using the overlap and save method. The DFT-IDFT length is L+1 (where L is odd), and M, the downsample rate, is the number of samples that the input window "slides". The architecture in FIG. 1 has 50% input vector overlap, that is, the downsample rate, is equal to half the input vector length M=(L+1)/2. With such an architecture a M+1 coefficient, or Mth order FIR filter may be implemented in the frequency domain. The filter, h(n), is zero-padded to length L+1 and then transformed to the discrete frequency domain via the DFT, to obtain the frequency domain coefficients, H i=DFT{h(n)}. (Note that any FIR filter with an order M or less can be used with this same architecture).

Referring to FIG. 3, an input stream x(n) 301 is provided to the architecture of the embodiment. The input 301 is provided without delay to downsample block 303.0. The input 301 is then provided through a series of delays 302 to L downsample blocks. The outputs of the downsample blocks 303.0 through 303.L are provided as inputs to DFT 304. As noted above, the downsample rate is such that there is a 50% vector overlap.

The DFT 304 transforms the input signal x to the discrete frequency domain and outputs frequency domain vectors X The frequency domain vectors are multiplied by the coefficients of frequency domain filters $H_1$-$H_L$. The resulting frequency domain filtered signals are provided to the IDFT 305 to provide outputs 0 to L. The outputs from 0 to (L−1)M/(L+1) are discarded. The remaining outputs provide time domain filtered output y(n).

One possible limitation in this method is that the DFT-IDFT, or fast Fourier transform-inverse/fast Fourier transform (FFT-IFFT) lengths are increased to increase the order of the FIR filter to be implemented. To implement very large filters with such methods in VLSI application specific integrated circuits (ASICs) or field programmable gate arrays (FPGAs) becomes very complex and requires large gate counts.

An embodiment of the invention takes advantage of the fact that the total number of computations to perform the computation goes down as does the processing rate. For a VLSI architecture in which parallel processing, or processing rate reduction, is the goal the invention provides a solution to this problem. Consider the convolution sum of equation 1. The convolution may be broken into numerous subconvolutions, each time shifted input convolved with a subfilter, as indicated.

$$y(n) = \sum_{k=0}^{N-1} x(n-k)h(k) = \qquad (1)$$

$$\sum_{k=0}^{j_1} x(n-k)h(k) + \sum_{k=j_1+1}^{j_2} x(n-k)h(k) + \ldots + \sum_{k=j_R}^{N-1} x(n-k)h(k)$$

Observe that each sample vector input to the DFT of FIG. 3, and therefore the frequency domain vector, is a time delay of M samples from the next sample vector input. From (1), it is obvious that each of the sums are themselves a convolution with a block of the filter or subfilter, we call these subconvolutions with subfilters, the sum of their outputs is equal to the convolution of the input, x(n), with the filter h(n). Each of these sub-convolutions may be implemented in the frequency domain using the technique illustrated in FIG. 3, then the results summed to yield the convolution output.

To break a convolution up into R equal length subconvolutions, each (L+1) in length, using this method would require R DFTs, R IDFTs, and R filter banks. Assuming 50% overlap, the DFT-IDFT pairs would each be in (L+1) length, however simplifications requiring only one DFT-IDFT pair are possible with one additional constraint. We can derive the constraint by realizing that each input vector to the DFT of FIG. 3 is a shift in time of M samples, therefore each frequency domain vector is separated in time from the previous or next vector by M sample periods. From (1), if $j_i+M=j_{i+1}$ ∀ i, that is the time delay between each sub-filter is equal to the time delay between time-consecutive input vectors, then the convolution of (1) may be calculated in the frequency domain by delaying the frequency domain vectors and multiplying by the appropriate frequency domain subfilter. These sub-filters are generated as follows.

$H_k(i)=DFT\{h_k(n)\}$ $i=0, \ldots, L, k=1, \ldots, R$ $n=0, \ldots, L$ $\qquad (2)$ and $h_k(n)$ is the $k^{th}$ zero padded sub-filter given by:

$$h_k(n) = h(n + (k-1)M) \; n = 0, \ldots, \frac{L-1}{2}, k = 1, \ldots, R \qquad (3)$$

$$= 0 \; n = \frac{L+1}{2}, \ldots, L, \; k = 1, \ldots, R$$

Figure 4:
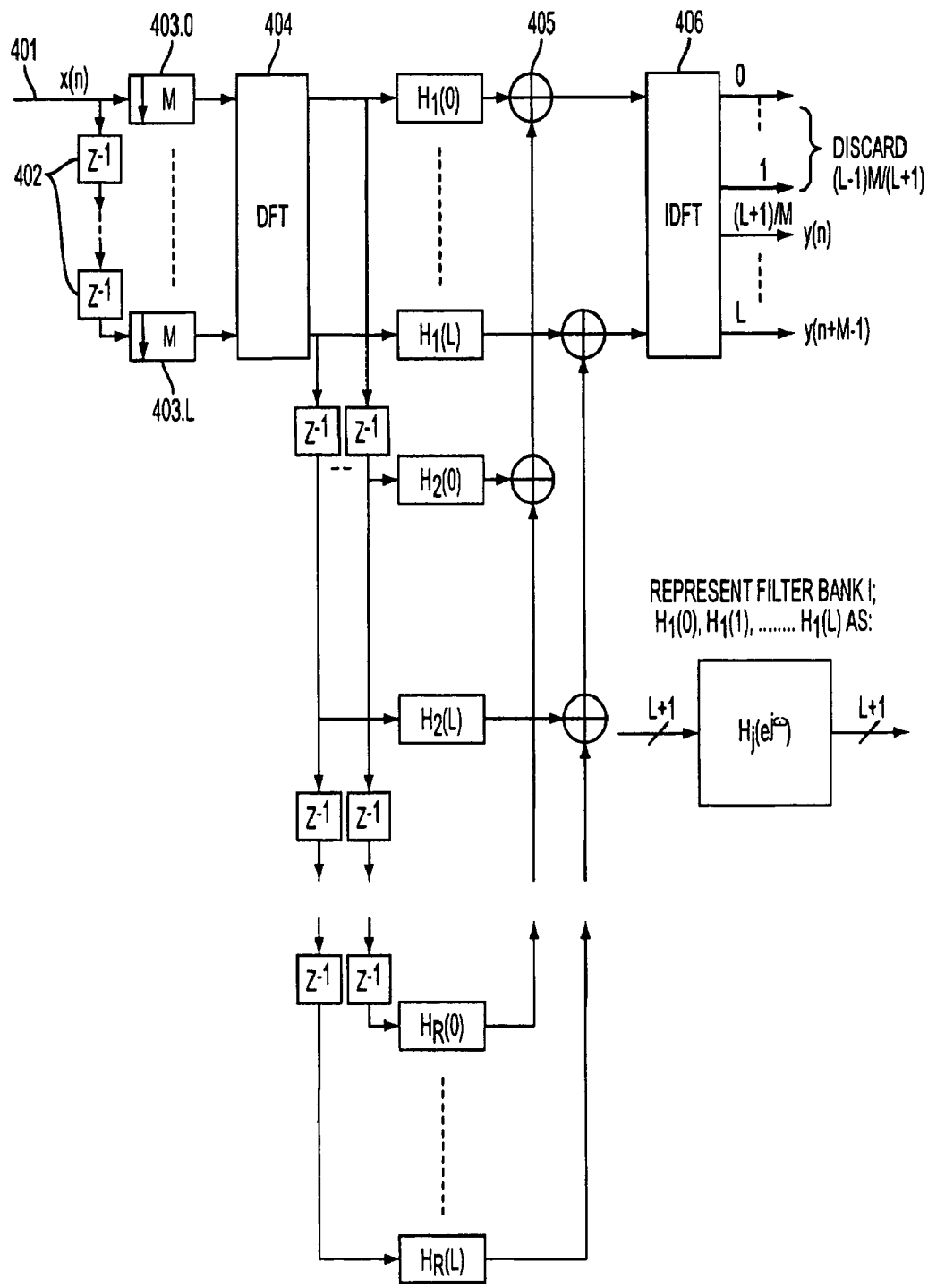
FIG. 4 is a block diagram of a parallel subconvolution filtering embodiment of the invention.

Using simple properties of linearity only one DFT-IDFT pair of this length is required as all of the frequency domain subconvolutions may be calculated then summed in the frequency domain then transformed back into the time domain. The resulting architecture is illustrated in FIG. 4. This system performs convolution at a rate of 1/M that of the sample rate. It is clear that the length of the DFT-IDFT pairs may be chosen with rate reduction as the principal design criterion independent of FIR filter length. This architecture then allows relatively short DFT-IDFT lengths to be used to reduce the processing rate of high order FIR filtering or correlation operations, yielding overall simple designs.

The architecture is represented in FIG. 4, where the 3rd-order FIR sub-filters, h i (n), are zero-padded to length 8 and then transformed to the discrete frequency domain via the DFT, H i (k)=DFT{h(n)}.

Referring to FIG. 4, the input signal 401 is coupled through downsample blocks 403.0 through 403.L to a DFT 404. In the example shown the signal is separated into L streams with the streams 0-L having sample delay ranging from none for stream 0 to L delays for stream L. Each stream is coupled to a downsample block to provide a 50% (4 sample) overlap. The outputs of the downsample blocks are provided to the DFT 404 for transformation to the frequency domain. Each of the outputs 0 through L of the DFT 404 are frequency domain vectors which are multiplied with frequency domain filter coefficients. In the embodiment of FIG. 4, each frequency domain vector is further split so that subconvolution operations can be applied. Here there are R sets of subfilters, each having L coefficients. Frequency domain vectors 0-L are provided to each set of subfilters, but with successively increasing delay. The frequency domain vectors are provided to the first set of subfilters $H_1$ with no delay, to subfilters $H_2$ with one delay and so on, up to subfilters $H_R$ with R-1 delay. The outputs of the 0 coefficients from each subfilter is summed at one of summing nodes 405 and provided to IDFT 406 for conversion back to the time domain and produce the desired filtered outputs. Similarly the outputs of each of the 1-L coefficients in each of the subfilter 1 through L are respectively A. summed and provided to IDFT 406.

An example can illustrate some of the advantages of the present invention. Consider the PSFA of FIG. 4 a 12-coefficient filter architecture is provided operating at one-fourth the rate of a serial equivalent. In addition there is a computation reduction. Assuming complex inputs a 12-tap complex filter requires 12 complex multiplies to produce an output. The architecture in FIG. 4 requires 5×2 (DFT-IDFT)+8×3 (frequency domain filtering)=34 multiplications to produce four filtered outputs. That is 34/4=8.5 multiplies per filter output, while a serial convolver obviously requires twelve multiplies per output. Assuming complex inputs, the serial convolver requires 12 complex multipliers to implement (assuming no hardware reuse), the PSFA requires 34 complex multipliers (as opposed to 48 for time domain parallelization). Since the 8-point PSFA is operating at one-fourth the rate, a CMOS implementation requires less power than the serial convolver.

Using the techniques of the present invention, any order FIR filter may be implemented with virtually any length FFT-IFFT pairs in the manner outlined above. This design method allows very high order filters to be implemented using relatively simple designs with less computation (and power) than traditional serial convolution. The following describes the general design rules for implementing embodiments of the present invention.

1) Overlap and save method, FFT length L+1 and filter length N+1, M=(L+1)–number of samples of overlap:

2) If subconvolution is used there is an additional constraint. The delays in the frequency domain introduce sample time delays equal to the number of samples the input vector is sliding (M),this must be equal to the time (sample) delay from the beginning of one subfilter to the beginning of the next, from equation (1), for all i. (It should be noted that other delays may be possible in other designs and the delays do not necessarily need to be identical in each subfilter. Integer delays may be introduced using phase offsets in the frequency domain, but this may also change the IDFT output pins the filtered data comes out on).

Modular Embodiments

Figure 5:
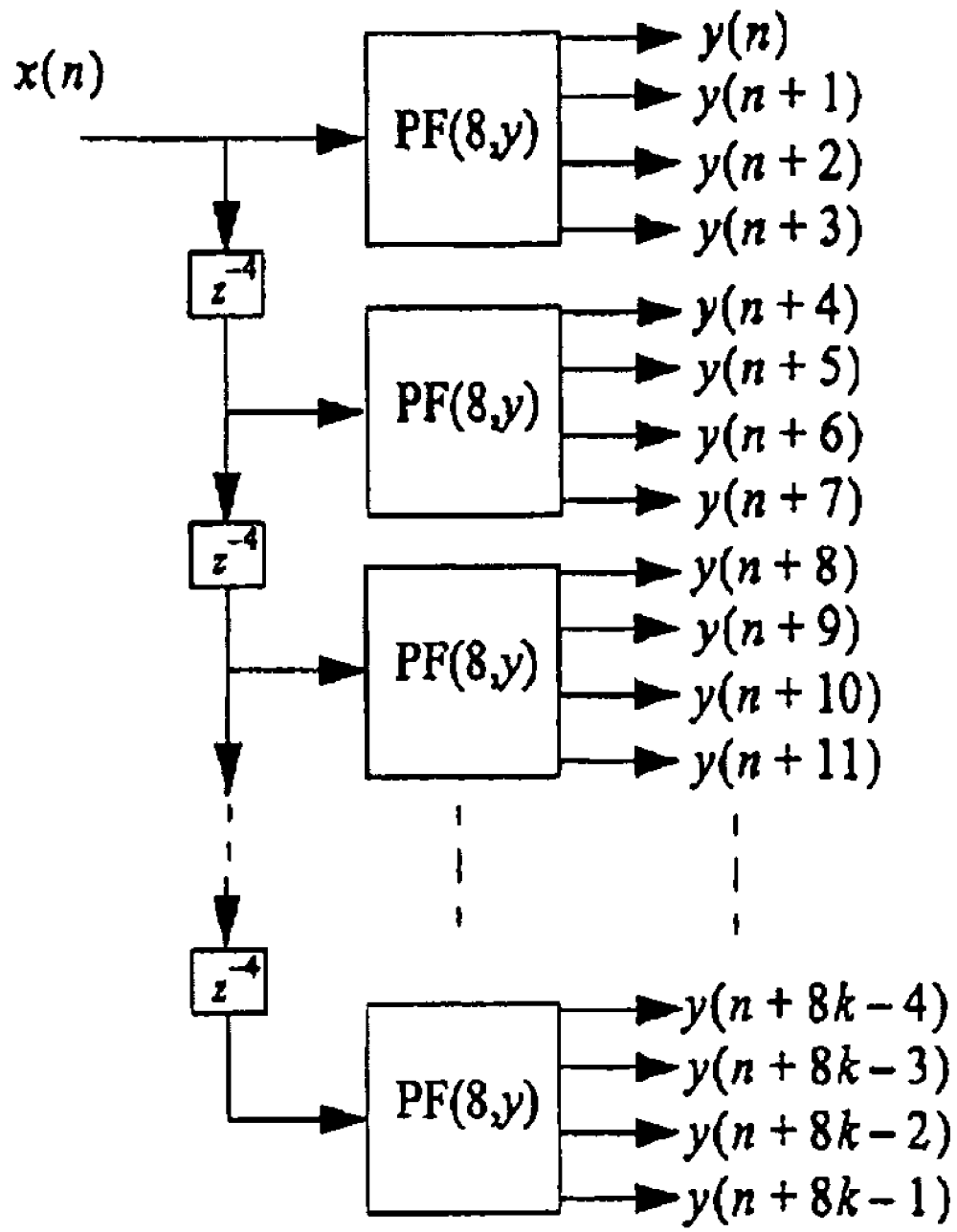
FIG. 5 is a block diagram of a modular embodiment of the invention.

FIG. 5 illustrates a scheme for modularizing the present invention by having a plurality of parallel filters (PF's) themselves in parallel operation. FIG. 5 illustrates a generic parallel pulse-shaping filter architecture, (8-MPF(8, y=8k), for $T_s=4T_{sym}$, and rate reduction 8k, where k is an arbitrarily large integer. Input x(n) 501 is provided to a plurality of PF's 503.2-503.8, through a series of delays 502 and directly to PF 503.1. The delays each provide a delay of four between each PF module. The resultant output of the parallel modular architecture is from y(n) to y(n+8k−1).

Figure 6:
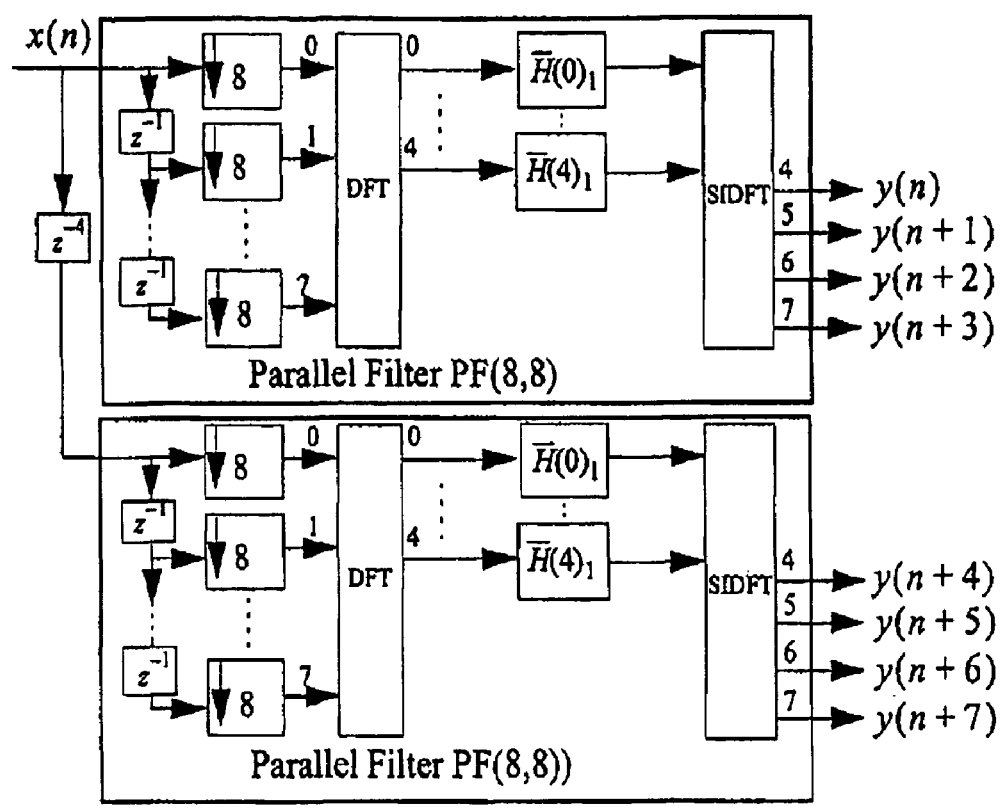
FIG. 6 is a block diagram of a modular parallel filtering scheme of the invention.

The PF's can be implemented as parallel filters or as parallel filters with subconvolution. FIG. 6 illustrates an embodiment of modular PF's 603A and 603B using parallel filters. The parallel filters operate as described above with respect to FIG. 3. However, there is a delay of 4 between the two parallel filter block modules. This delay along with the downsampling at the input to the DFT, determines the overlap of data from one vector to the next. The first parallel filter block processes the first input (clock cycle), third input, that is all odd input vectors. The second block processes all the even vector inputs. There is of course "memory" or sample overlap between the two blocks that is provided by the simple delay (in this case four) between the input of the two blocks. We denote the modular parallel filter blocks as N-MPF(x,y), where N is the number of identical parallel blocks, x is the DFT length, and y is the downsample rate into the DFT.

Figure 7:
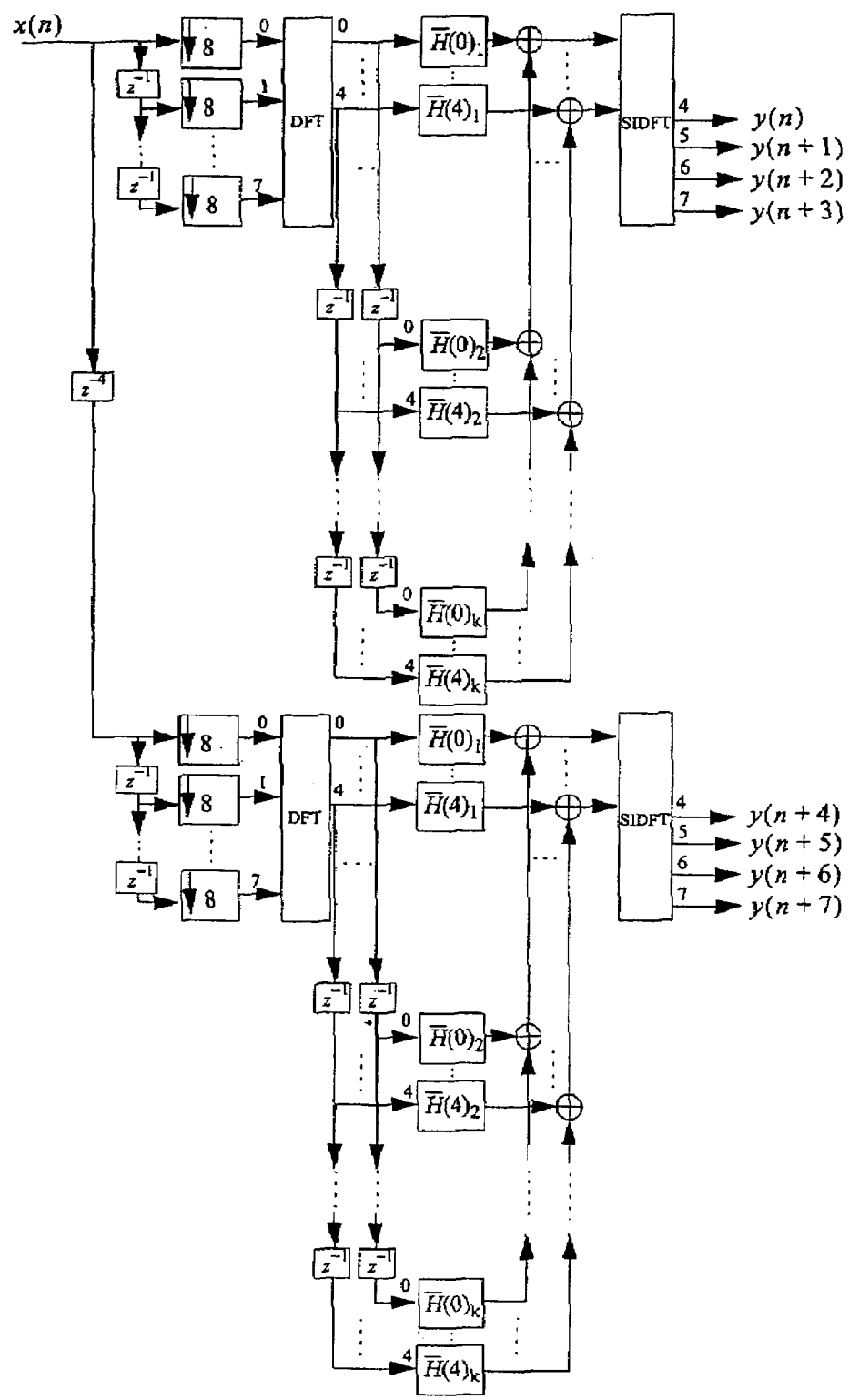
FIG. 7 is a block diagram of a modular parallel subconvolution filtering scheme of the invention.

FIG. 7 illustrates the modular PF environment using subcovolution. The modular parallel filter blocks employing subconvolution are given as N-MPSF(x,y,z). The variables x and y are not free variables and are determined as described previously, and the variable z is the filter length. Each parallel filter is denoted as PF(x,y). The rate reduction for this filter is 4N, in this design 4N=y. FIG. 7 illustrates a pair of PF's where each PF operates as described with respect to FIG. 4. However, there is a delay of 4 between the PF modules.

Other embodiments of the invention are described in Appendices A-D incorporated herein.

Thus, a method for parallel subconvolution filtering has been described.

Appendix A (Sheet 1 of 9)

Modular Parallel Efficient Pulse-Shaping Architectures

Andrew A. Gray, Jet Propulsion Laboratory/CalTech

Abstact

This paper outlines novel architectures for modular parallelization of discrete-time pulse-shaping filters based on the parallel subconvolution filtering architectures [1]. Much simplification may be made in the parallel filters due to the special nature of a class of pulse shaping filters. The motivation for the algorithms is to develop simple very large scale integration (VLSI) parallel architectures for pulse-shaping filters used in digital modulators. In addition it is extremely desirable that the rate reduction of these architectures be arbitrarily extendable and have relatively low design complexity and low transistor count. The architectures developed here use concepts developed in [2,3] as well as many concepts from multirate signal processing and traditional linear systems theory.

Introduction

Conventional complementary metal oxide silicon (CMOS) processors, either application specific integrated circuits (ASICs) or field programmable gate arrays (FPGAs), have substantially lower clock rates than the fastest commercially available digital-to-analog converters (DACs). In such a high rate system, the minimum number of samples required for digital processing, the Nyquist rate, is required to process the fastest data rate possible, the Nyquist data rate. Because CMOS hardware has lower clock rates than gallium arsenide (GaAs) hardware and therefore the fastest DACs, CMOS digital transmitters using traditional serial algorithms for digital communications process data rates approximately 10 times lower than the maximum Nyquist data rate, with data rates generated from FPGA processors even lower. We demonstrate this concept with a simple high-level example of a pulse-shaping filter used in a digital modulator. For this example as well as the design procedure we focus on the algorithms necessary to parallelize the processing in a modular fashion. Often a significant part of a true digital implementation is the determination of the degree to which the amplitude of the discrete-time signals may be quantized. We omit such considerations here.

Example 1

Figure 1 illustrates a simple modulator with a sample rate $T_s$ that is one-fourth the symbol rate $T_{sym}$. This is a reasonable sample rate for many applications, although many pulse shaping filters

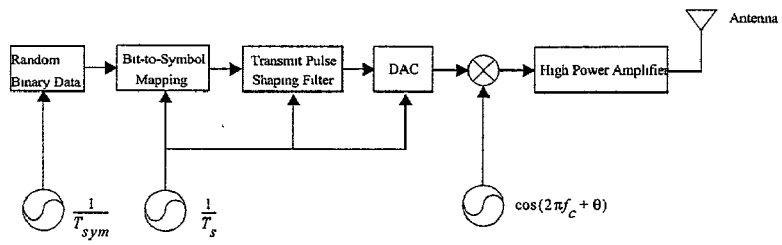

Figure 1. Modulator Block Diagram

Appendix A (Sheet 2 of 9)

may require a lower sample rate if derived strictly by the Nyquist criterion. This however may lead to a non-integer relationship between the sample rate and data rate. In theory this is no problem, however this will lead to cumbersome vector/block parallel implementations. Note that there is an implied upsampler between the random data source and the bit-to-symbol mapper, that is to say zero samples are inserter in the added clock cycles.

As an example let the pulse shaping filter be a square-root-raised cosine (SRRC) matched filter with unit energy given by:

$$h_d(n) = h(nT_s) = \frac{\sin\left(\frac{(n)T_s}{T_{sym}}\right)}{\frac{nT_s}{T_{sym}}} \left( \frac{\cos\left(\pi R \frac{nT_s}{T_{sym}}\right)}{1 - \left(2R\left(\frac{nT_s}{T_{sym}}\right)\right)} \right) \quad n=1\text{-}16 \qquad (1)$$

Where the roll-off factor is equal to 0.25, $R=0.25$. Suppose the DAC operates at 1 Ghz, $1/T_s$, this would require that all digital pulse-shaping and bit-to-symbol mapper must operate at 1 Ghz which implies a custom/difficult CMOS ASIC design or a gallium arsenide implementation that is not desirable for many reasons [2]. To implement the filter in equation (1) would require 16 giga-multiplications per second. A parallel system operating at 125 Mhz or lower would be very desirable. There are many ways to parallelize the operations [2,3]. We present a new design based on a simplified version of the parallel subconvolution filter architecture [1].

Design of the Parallel Efficient Pulse-Shaping Architecture:

Assume we wish to implement a 15$^{th}$ order filter (16 coefficients) with a parallel filter bank consisting of only one 8-point DFT-IDFT pair with overlap of 50% (4). Equation 2 indicates the sub- $$y(n) = \sum_{k=0}^{3} x(n-k)h(k) + \sum_{k=4}^{7} x(n-k)h(k) + \sum_{k=8}^{11} x(n-k)h(k) + \sum_{k=12}^{15} x(n-k)h(k) \qquad (2)$$

convolutions. Using the design rules in [1], the resulting parallel subconvolution filter architecture is illustrated in Figure 2. However, there are significant simplifications that may be made based on the nature of the input signal.

First, we assume that the input is real, and second we realize that it is an upsampled signal, containing mostly zeros samples ($T_s = 4T_{sym}$). Since the signal is real the negative frequency domain coefficients are the complex conjugate of the positive frequencies, that is: $H(k)_i = H^*(|i-8|)_i$. These frequency domain coefficients as well the DFT outputs input to them need not be calculated. This leads to the development of a specialized DFT (SDFT) and IDFT (SIDFT) pair using simple linear systems concepts that omit computation that is unique to these frequency outputs and the zero sample inputs. The design procedures for such DFT-IDFT simplification may be found in [4]. Figure 3 illustrates the standard 8-point decimation-in-frequency DFT [4], Figure 4 illustrates the simplified design, the SDFT, for the pulse-shaping filter. Figure 4 illustrates the design of the SIDFT. Figure 6 illustrates the design of the 8-point parallel subconvolution filtering architecture designed for real input upsampled by 3. Again, there is no limit to

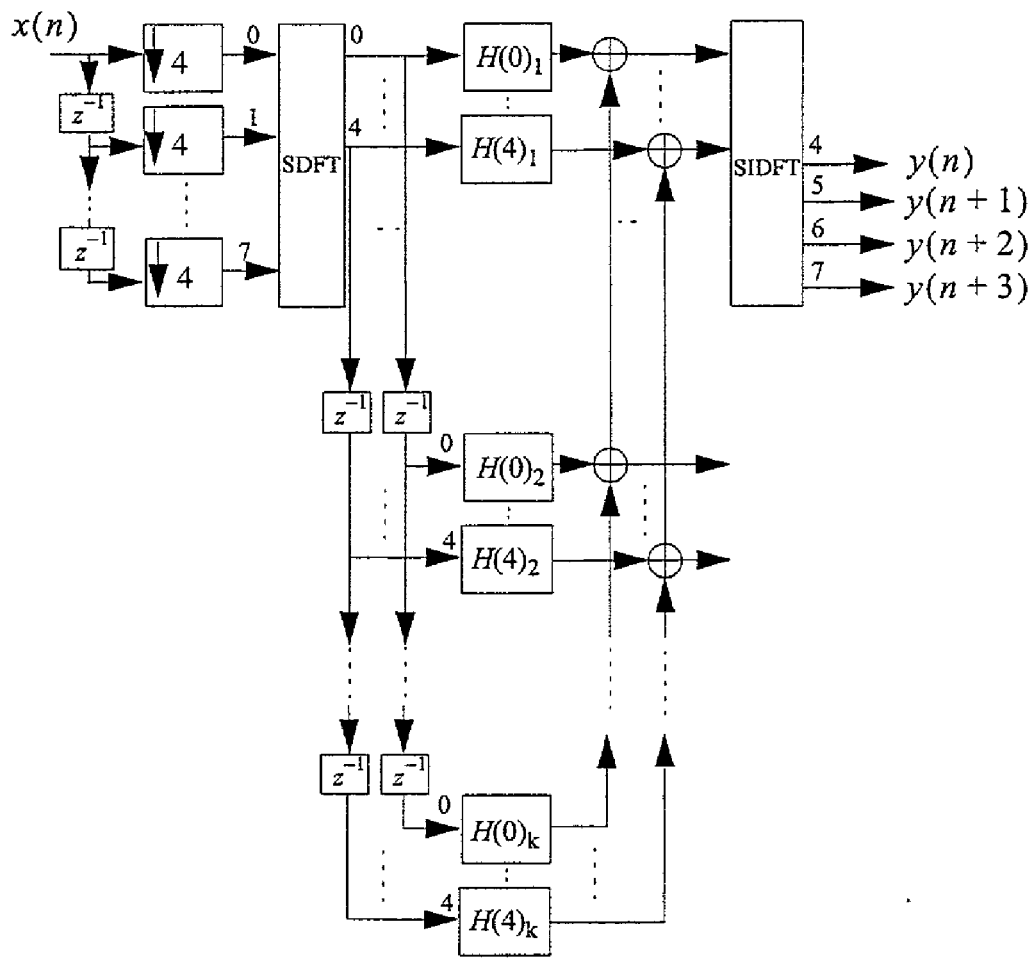
Figure 2. Parallel Subconvolution Filtering Architecture
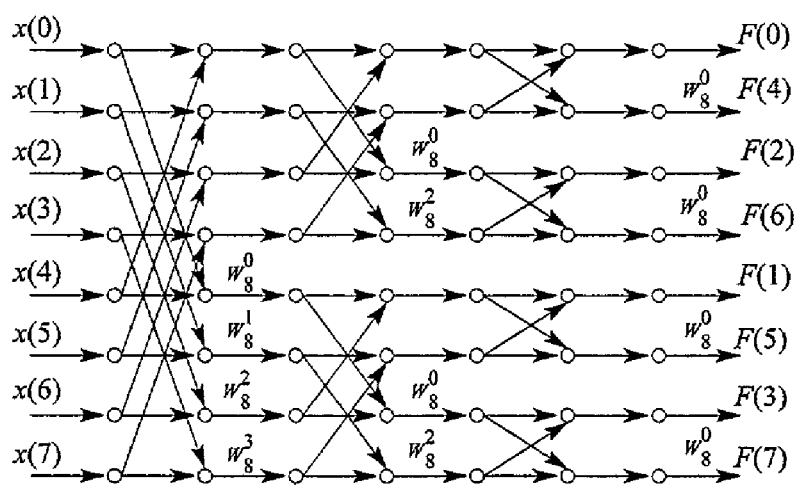
Figure 3. 8-Point Decimation-in-Frequency FFT Algorithm [1]

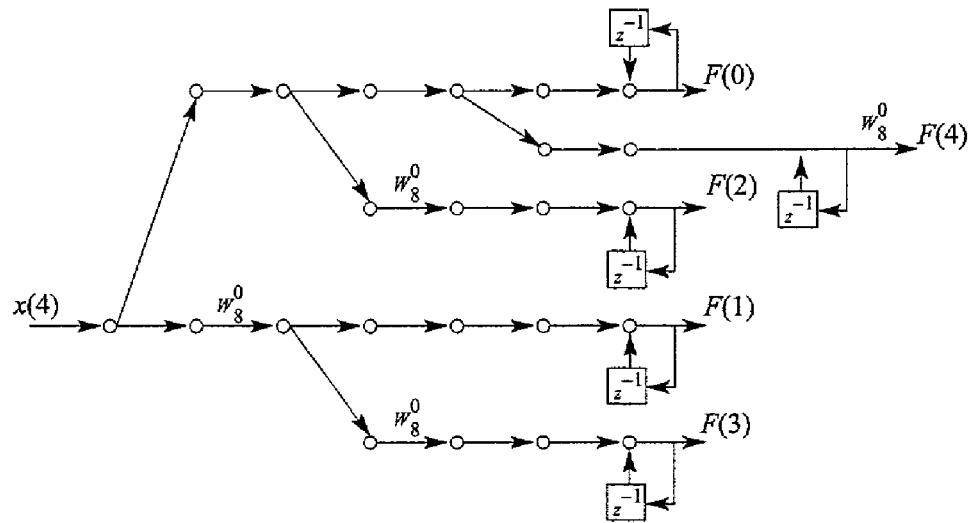
Figure 4. Specialized 8-Point DFT (SDFT) Algorithm for Sliding Window Input
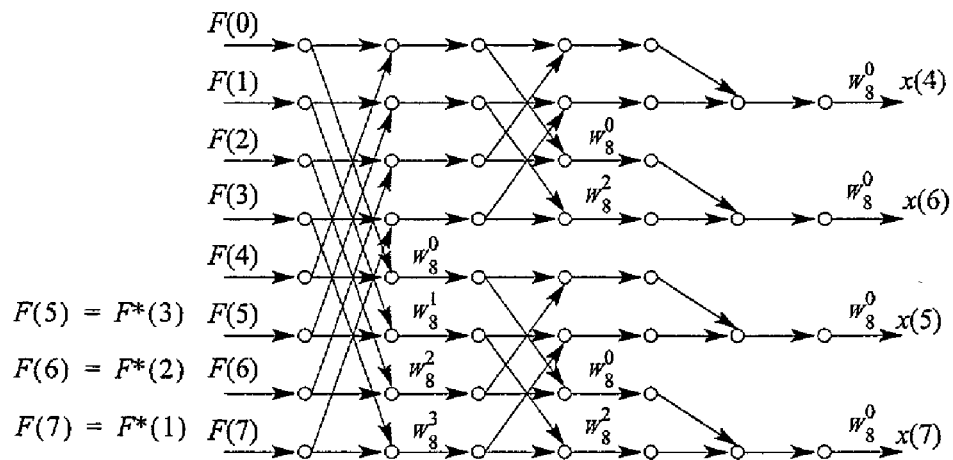
Figure 5. Specialized 8-Point IDFT (SIDFT) Algorithm with Four Outputs

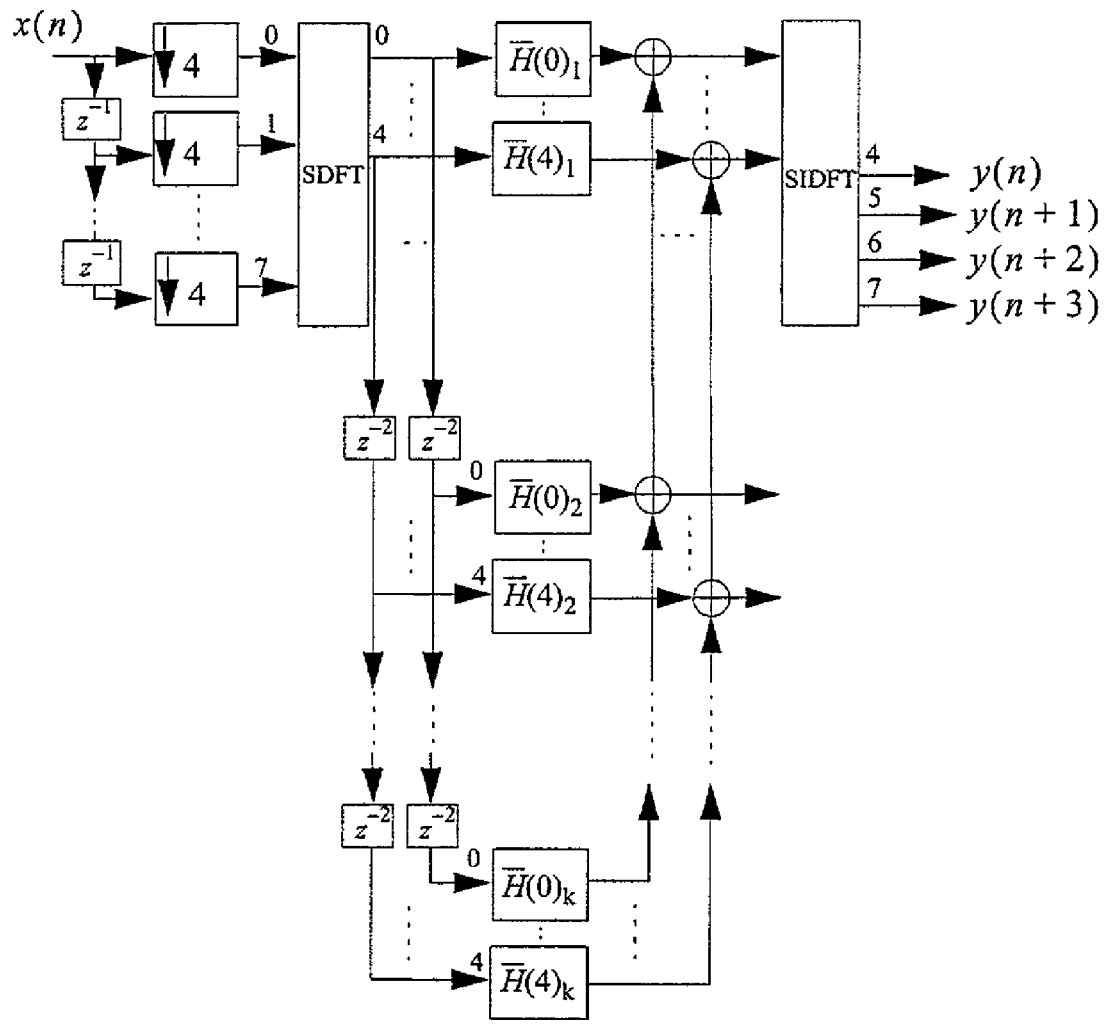
Figure 6. Simplified Parallel Efficient Pulse-Shaping Architecture

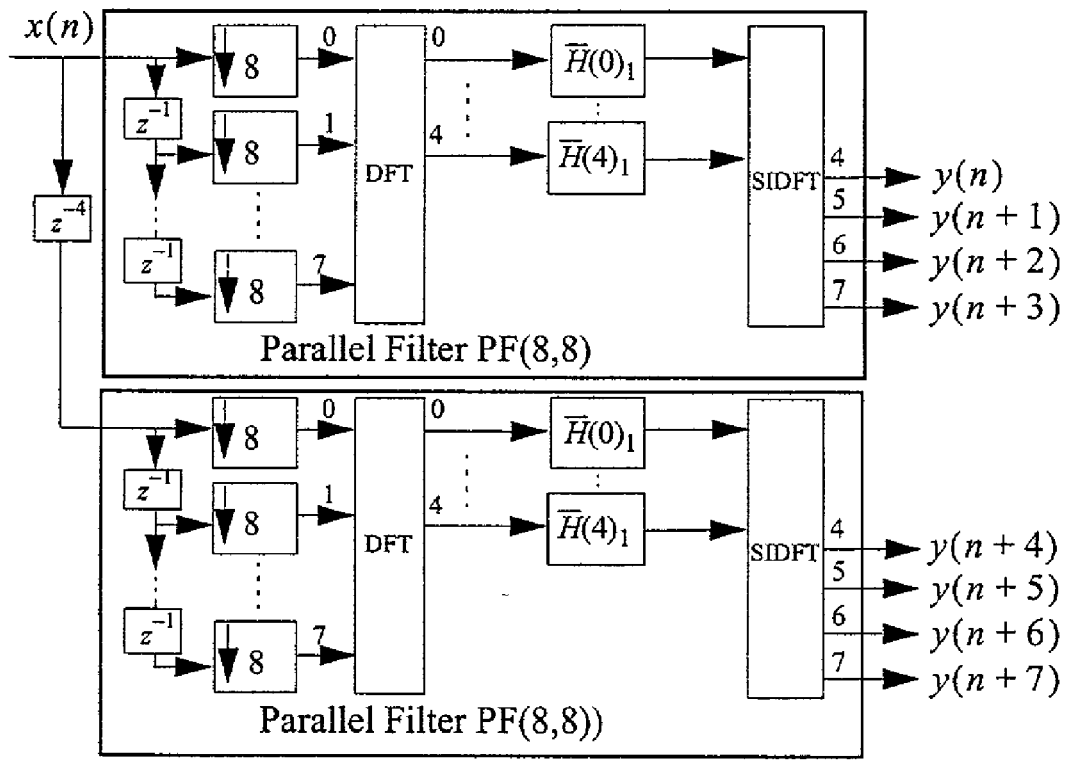
Figure 7. Modular Parallel Filtering, 2-MPF(8,8), Rate 1/8

Figure 8:
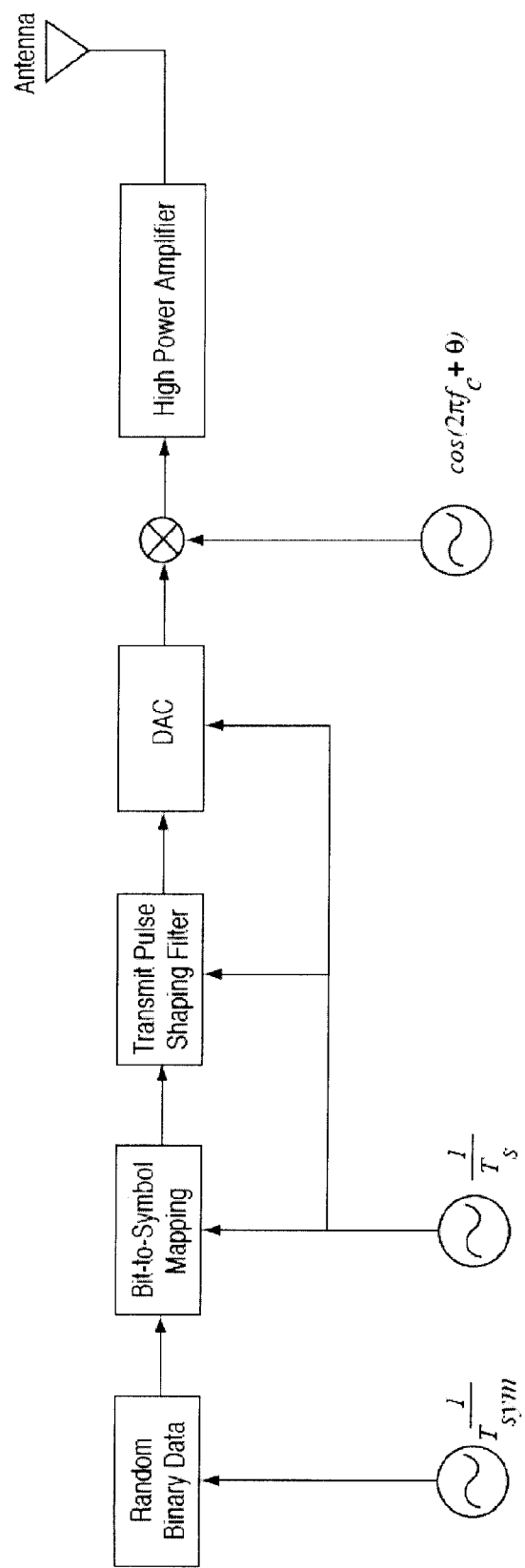
FIG. 8 is a modulator with a sample rate $T_s$ that is one-fourth the symbol rate $T_{sym}$

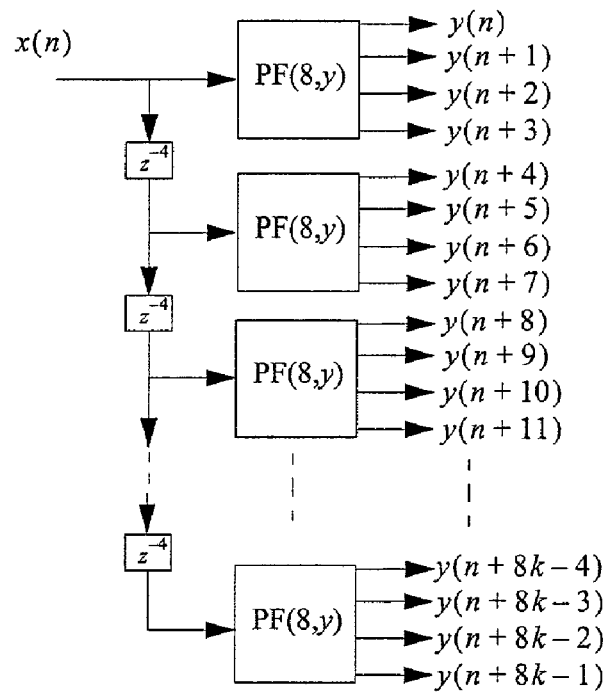
Figure 8. 8-Point Modular Parallel Filter Architecture, 8-MPF(8,$y=8k$), Rate Reduction: $8k$
Where $k$ is some integer

Figure 9:
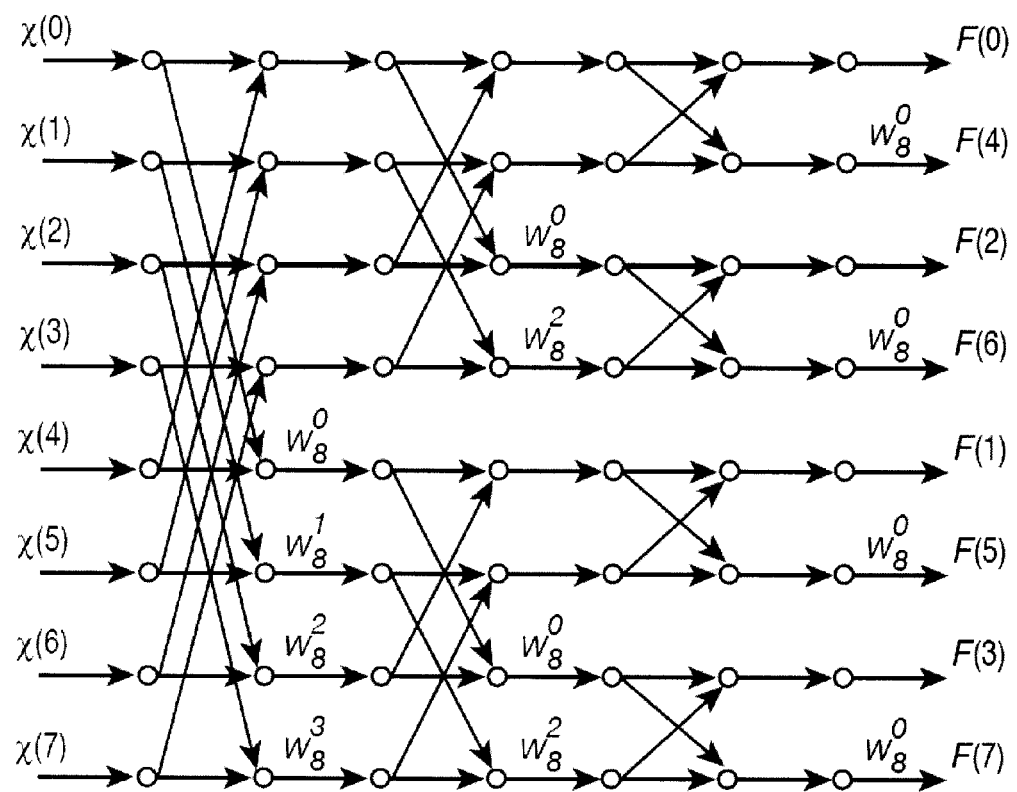
FIG. 9 illustrates standard 8-point decimation-in-frequency DFT
Figure 10:
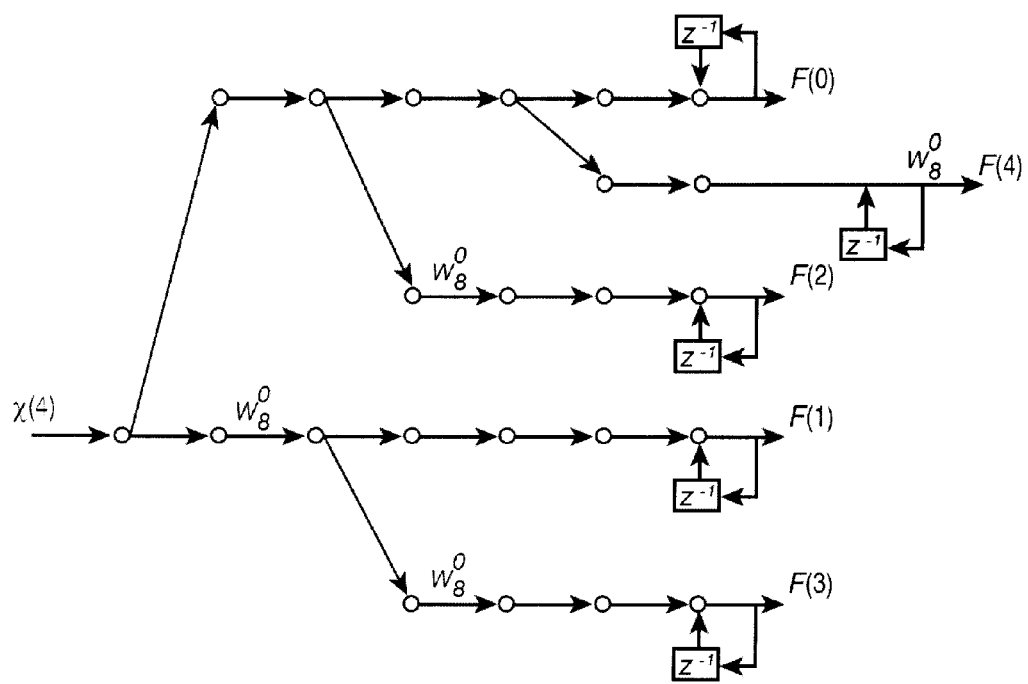
FIG. 10 is an SDFT design for a pulse-shaping filter.
Figure 11:
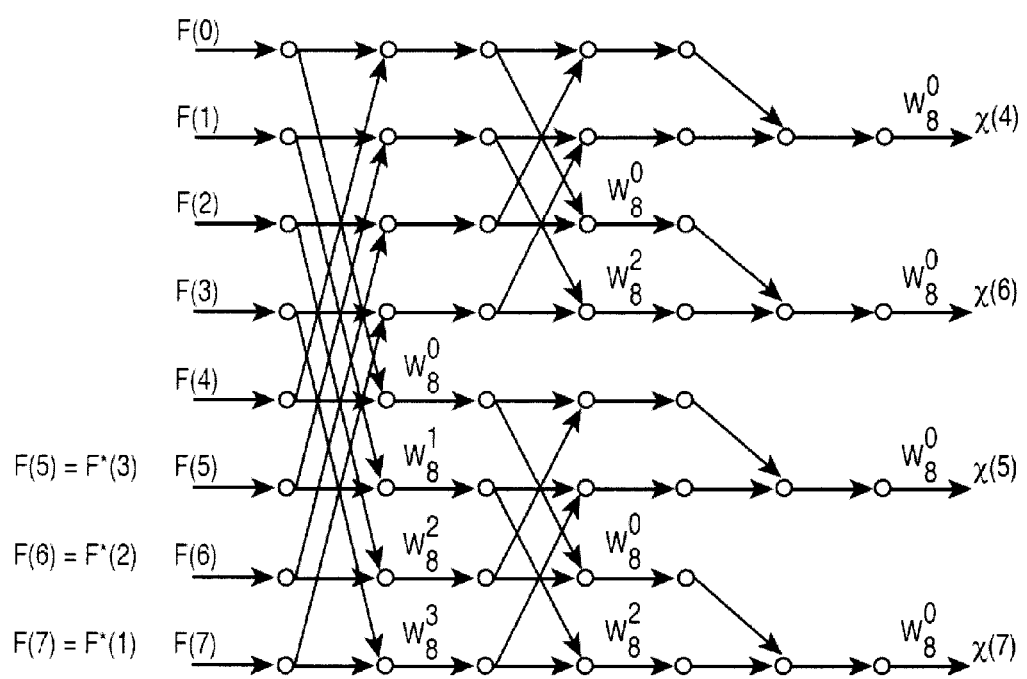
FIG. 11 is an SIDFT design for a pulse shaping filter.
Figure 12:
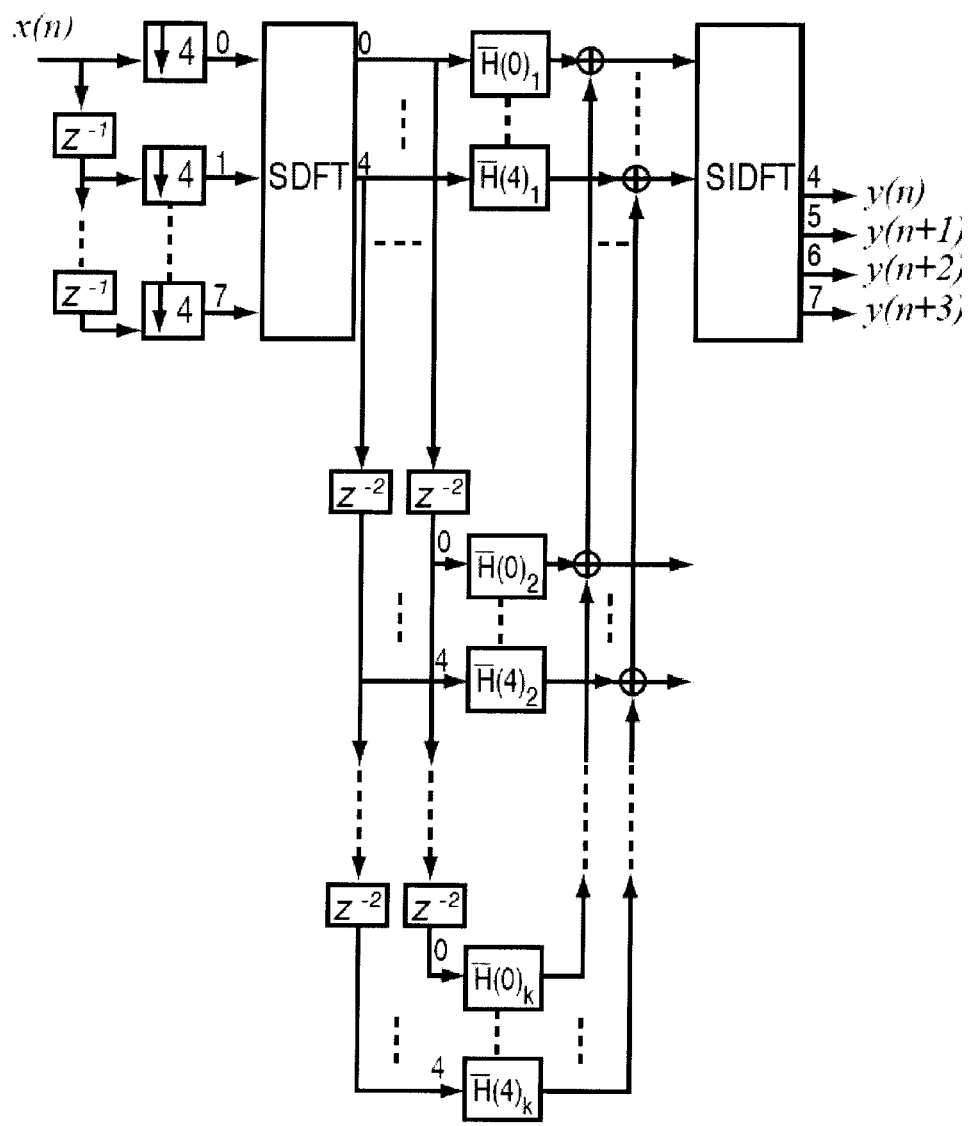
FIG. 12 is a design of an 8-point parallel subconvolution filtering architecture.
Figure 13:
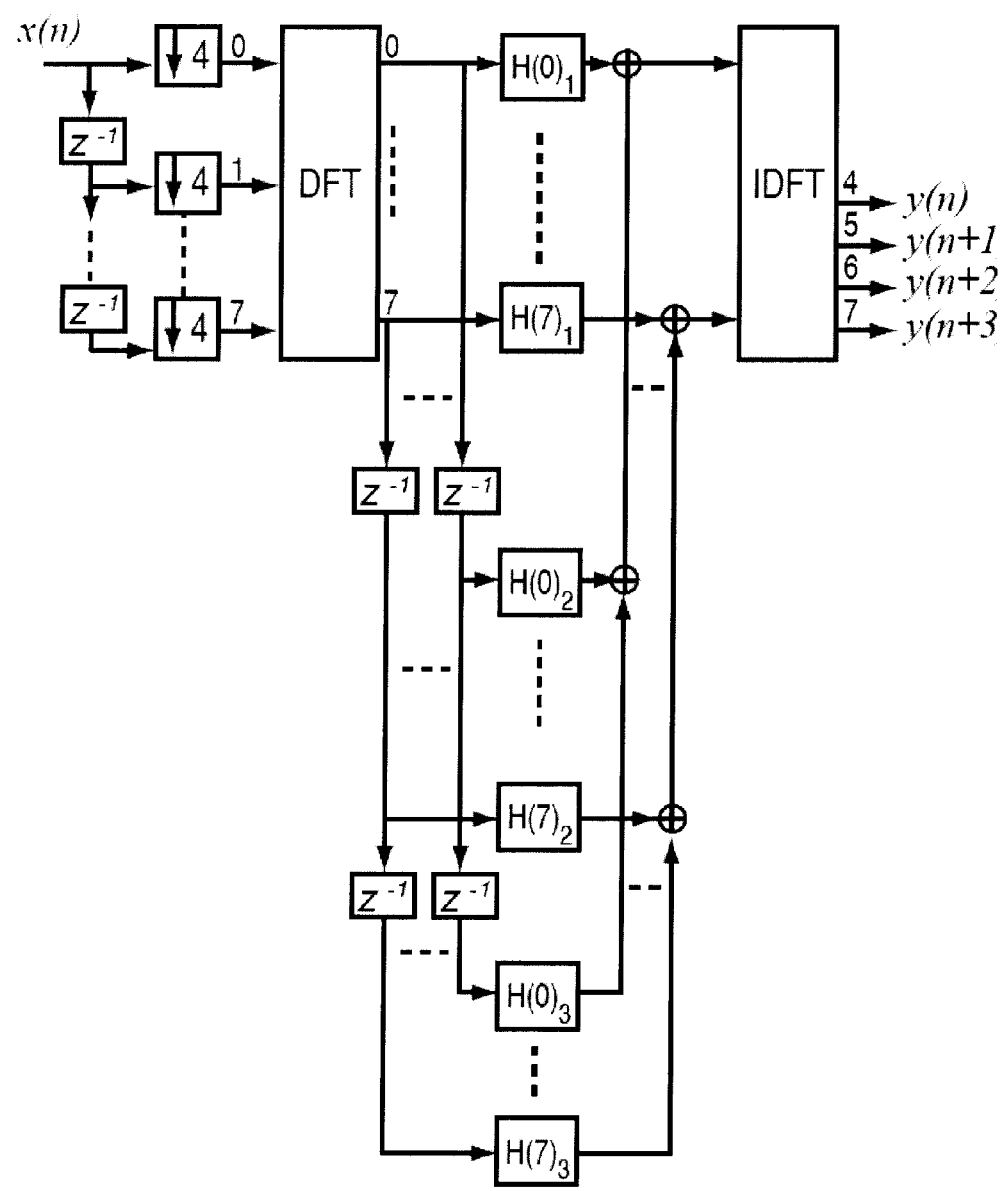
FIG. 13 is a design of a parallel subconvolution filtering architecture.
Figure 14:
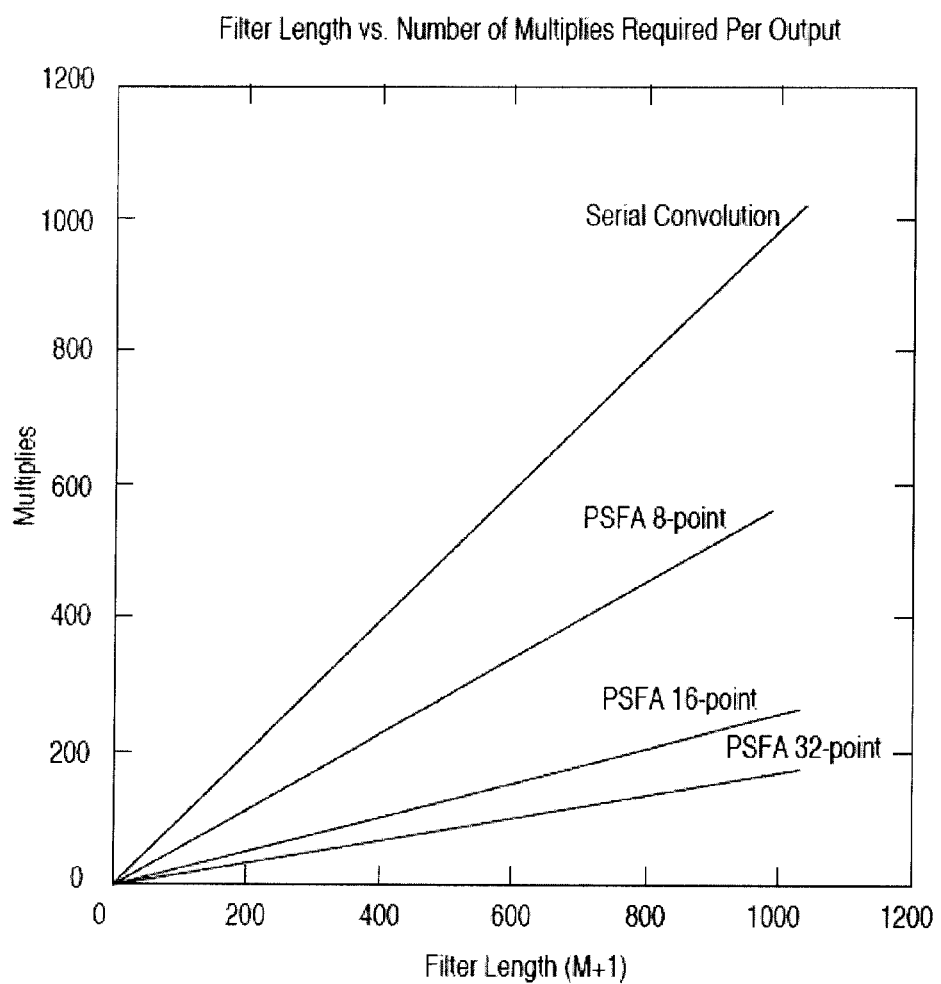
FIG. 14 is a plot of the number of multiplications required for serial convolution.
Figure 15:
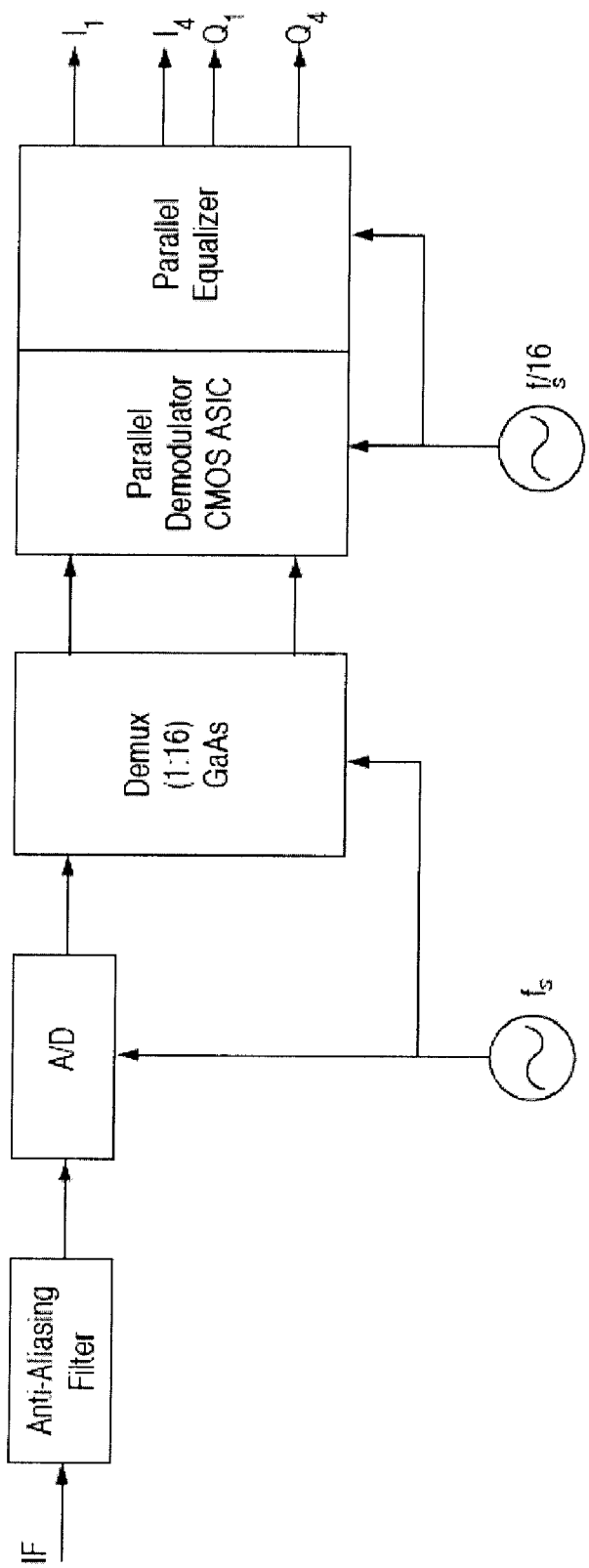
FIG. 15 is a block level diagram of a receiver.
Figure 16:
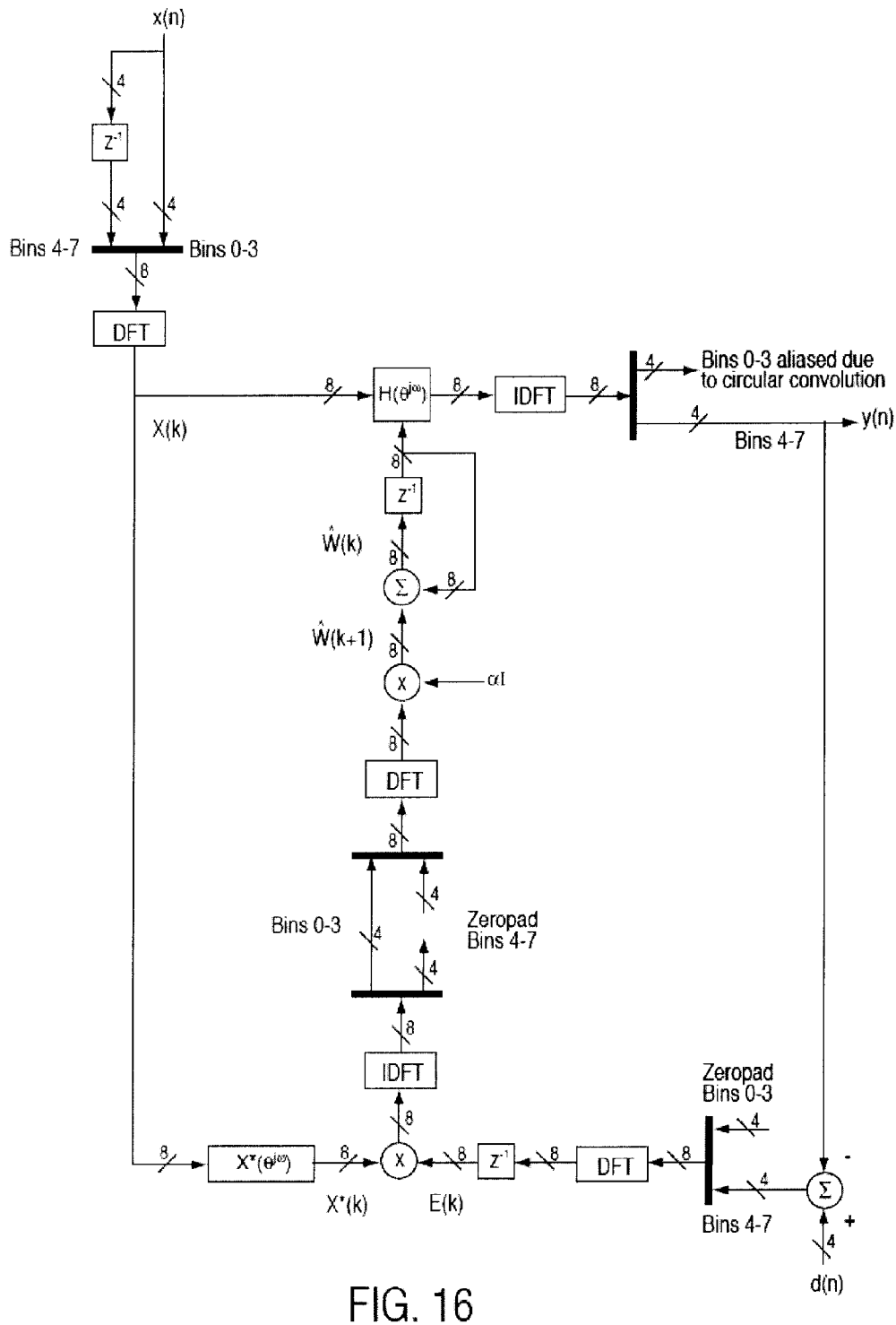
FIG. 16 is a $114^{th}$ rate frequency domain fast LMS architecture.
Figure 17:
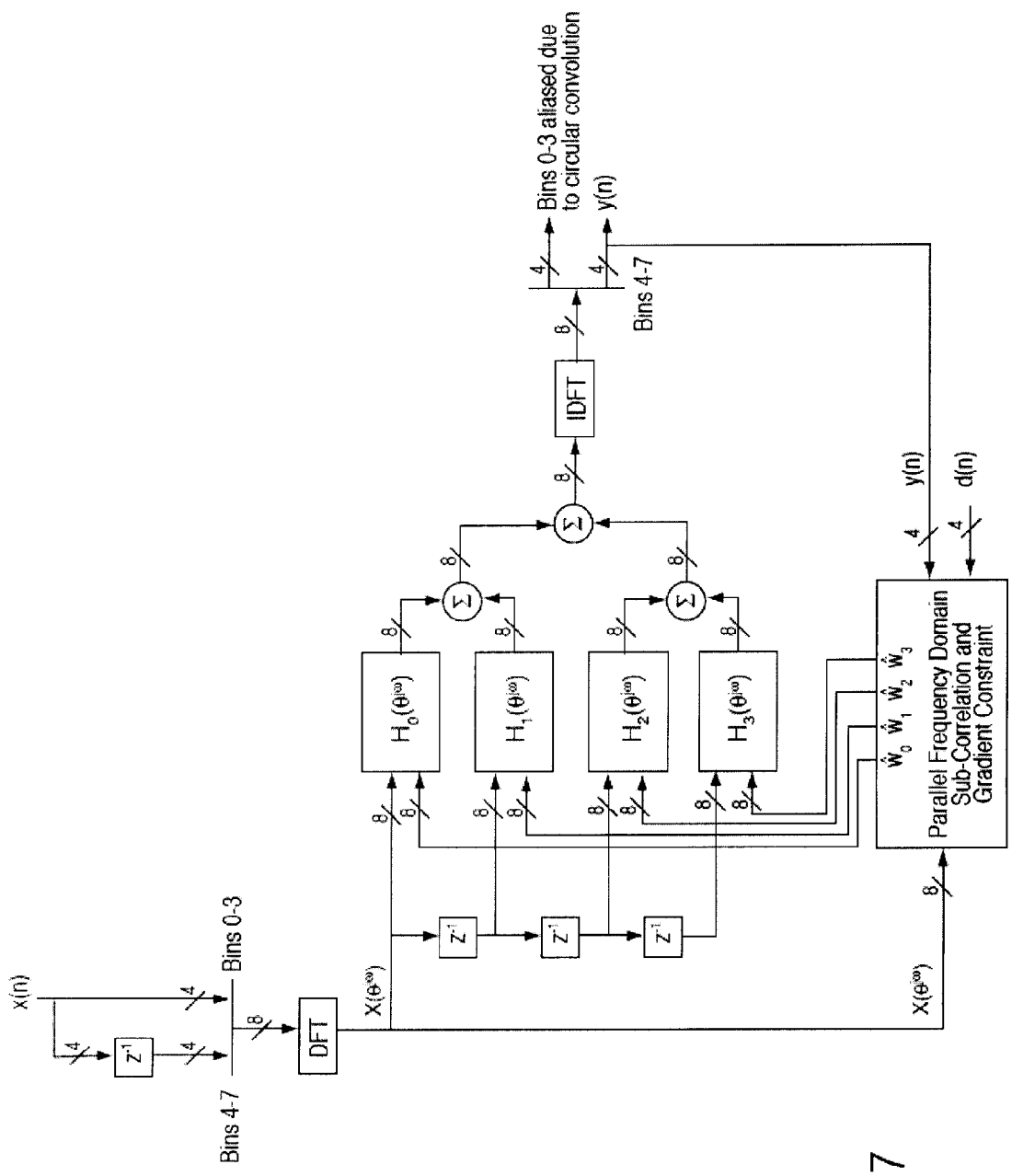
FIG. 17 is a frequency domain LMS architecture employing sub-conversion and sub-correlation.
Figure 18:
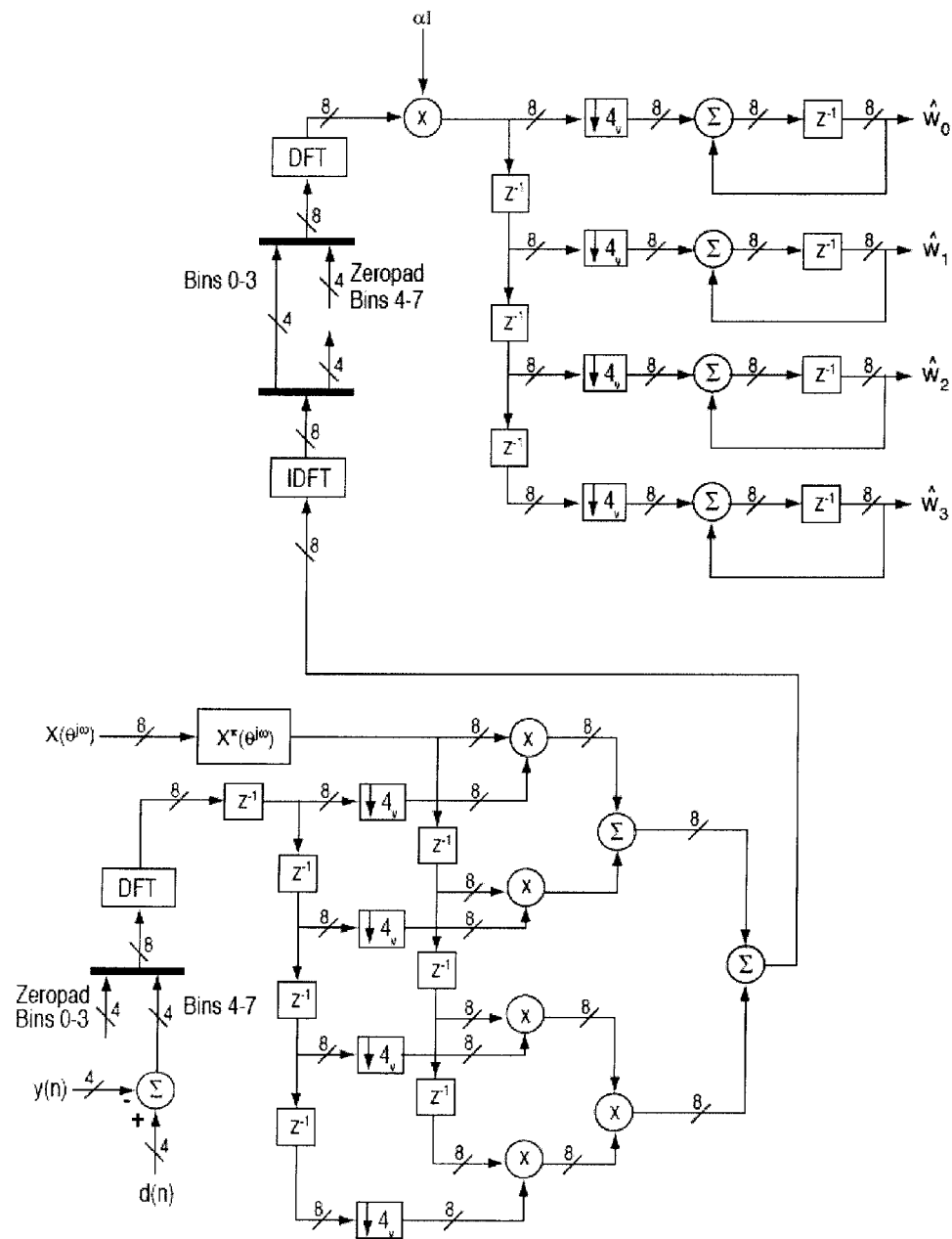
FIG. 18 is another embodiment of a frequency domain LMS architecture.
Figure 19:
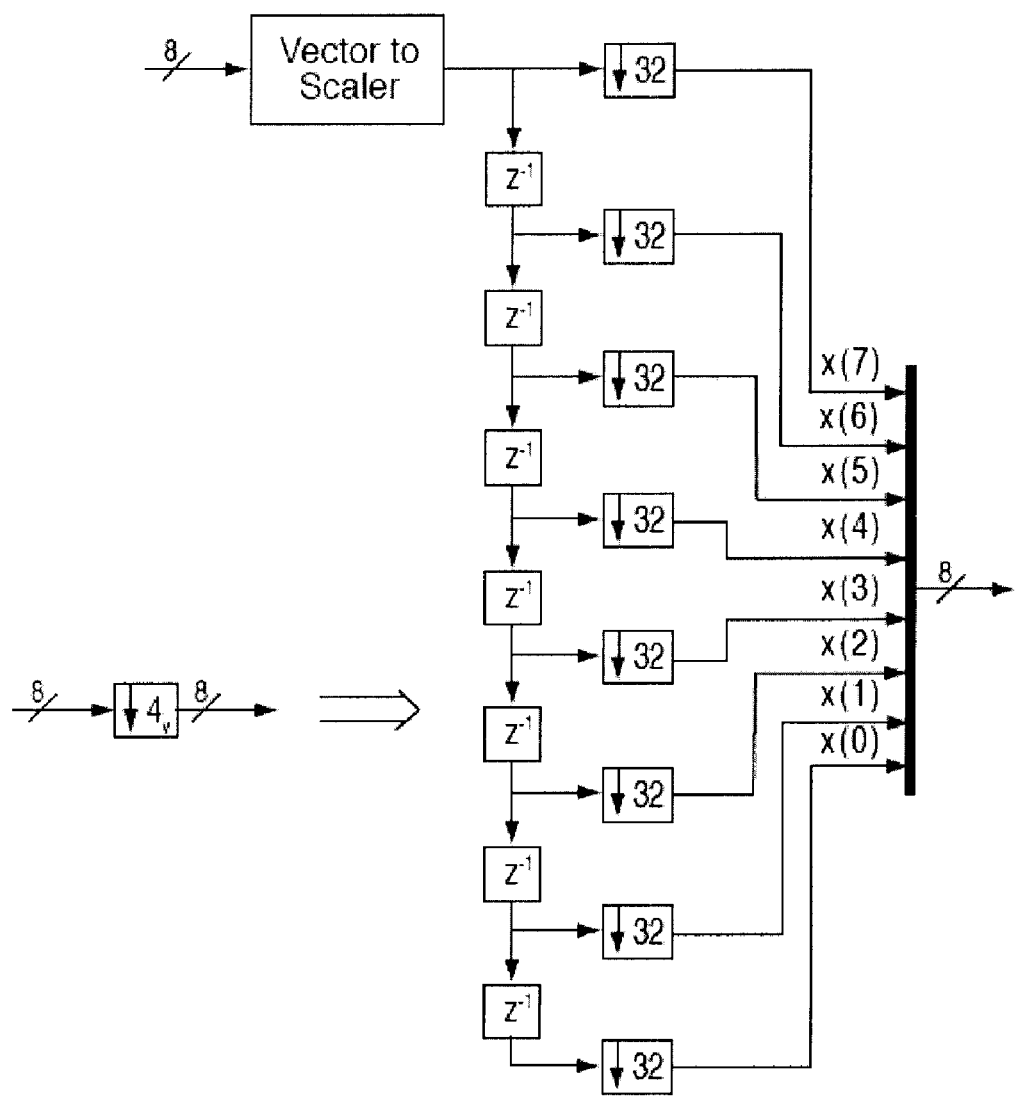
FIG. 19 is function of a vector downsampler.
Figure 20:
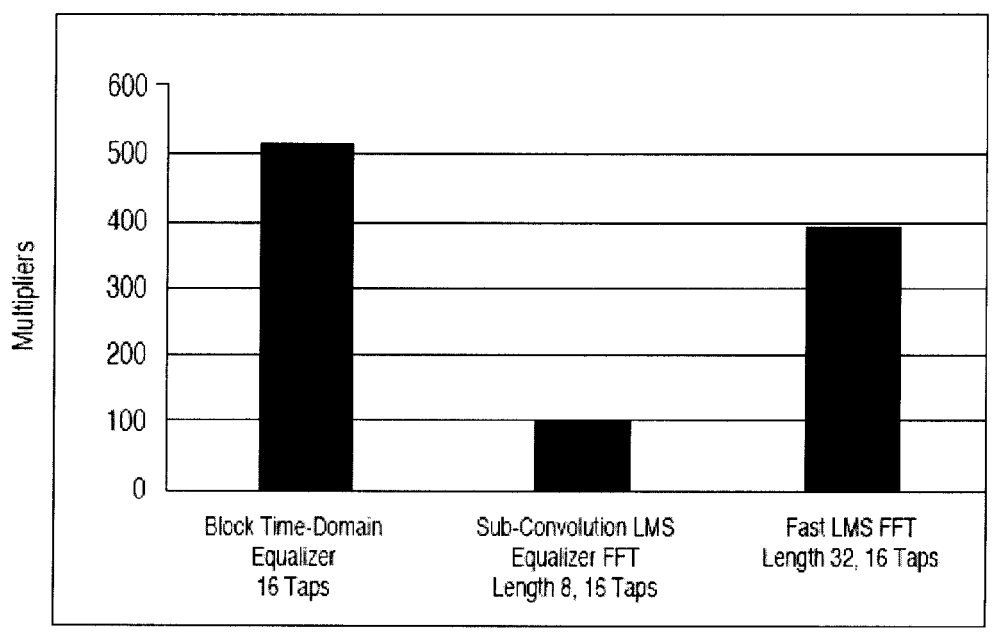
FIG. 20 is a plot of the approximate number of multipliers required to implement a three 16-tap architecture.
Figure 21:
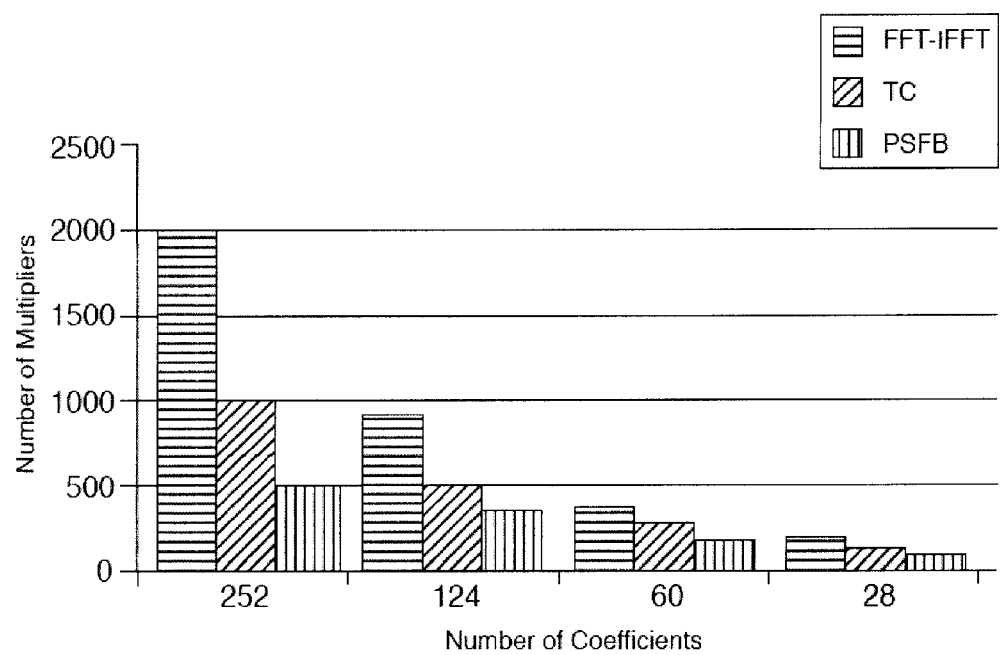
FIG. 21 illustrates the multiplier savings for certain values of M and N.
Figure 22:
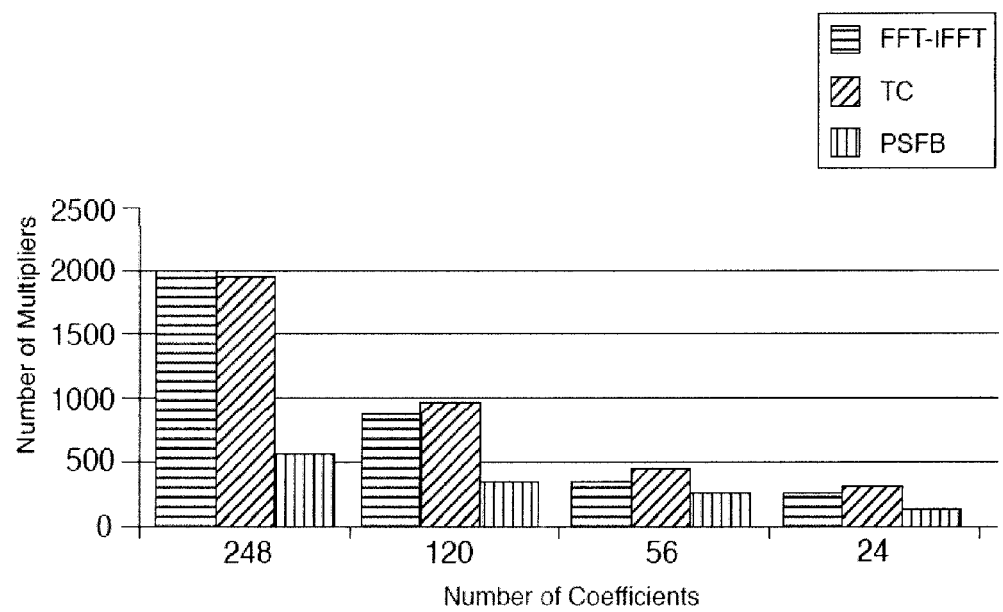
FIG. 22 illustrates the multiplier savings for certain other values of M and N.
Figure 23:
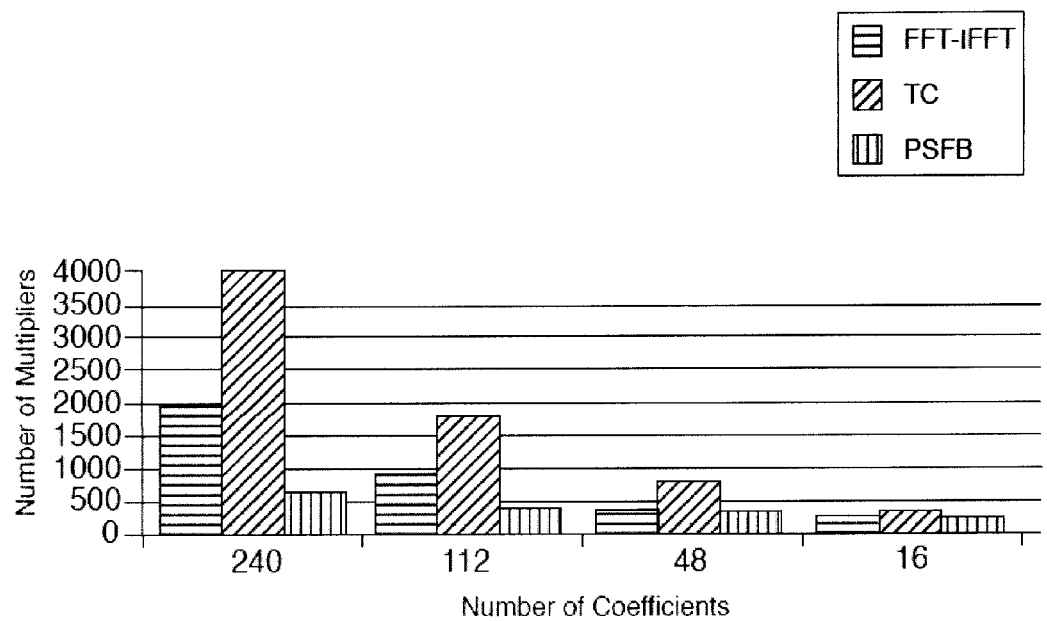
FIG. 23 is illustrates the multiplier savings for other values of M and N.
Figure 24:
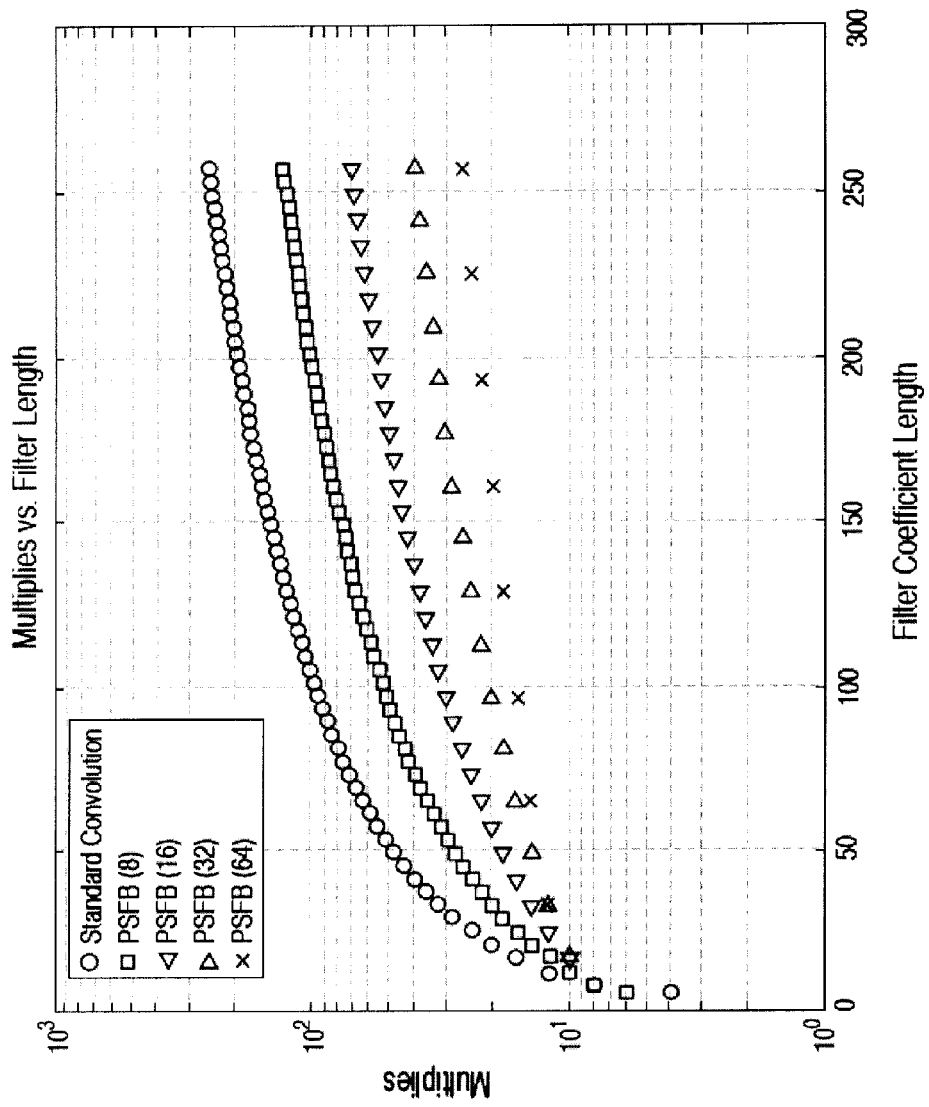
FIG. 24 is a plot of the number of multiplies required per filter output for traditional serial convolution.

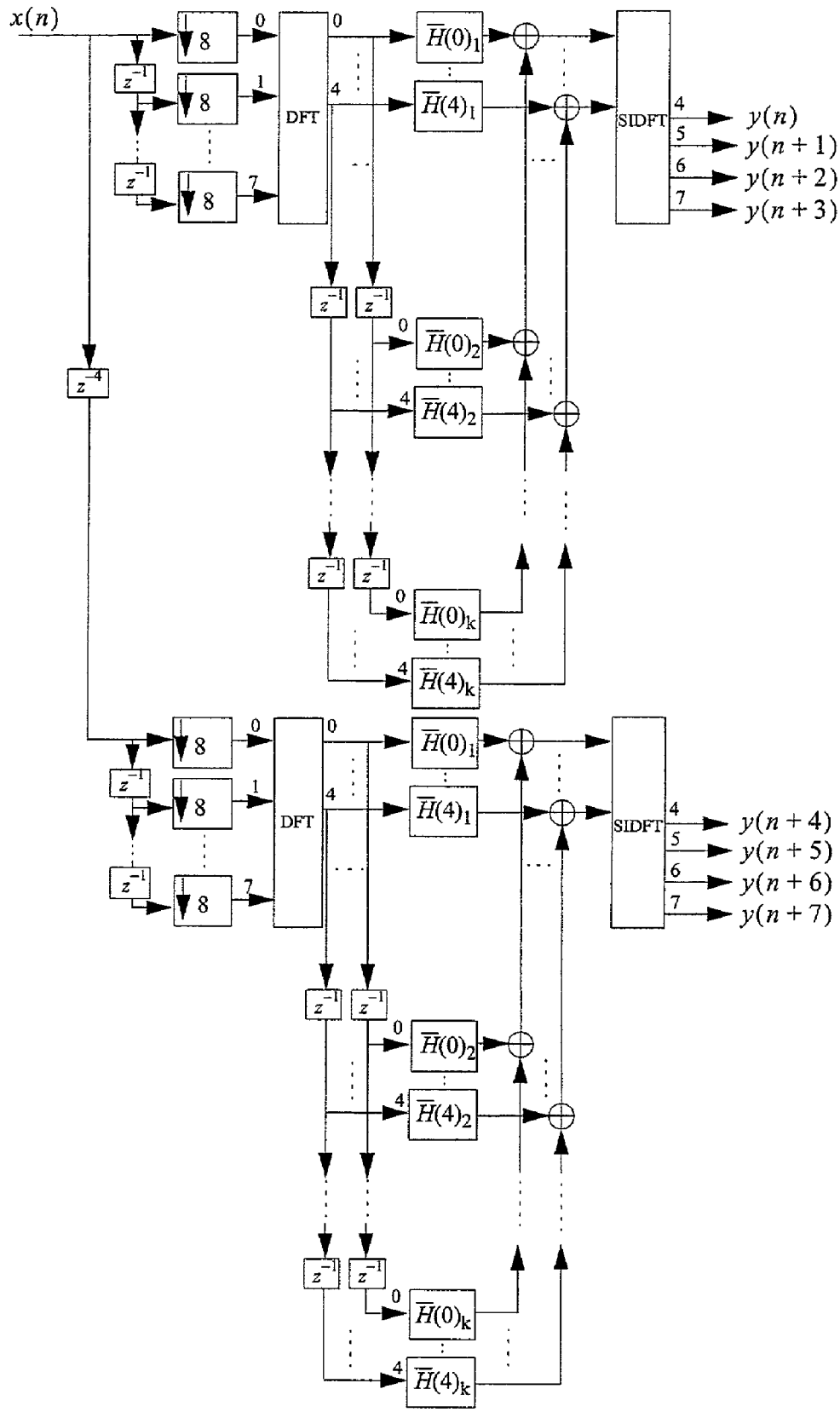
Figure 9. Parallel Pulse Shaping Filter, 2-MPSF(8,8,8$k$), Rate Reduction: 8

[1] Andrew A. Gray, *"Computationally Efficient Parallel Subconvolution Filtering Architectures"*, Submitted IEEE Electronic Letters, 2001

[2] A.V. Oppenheim, R. W. Schafer, *Discrete-Time Signal Processing*, Prentice-Hall, Englewood Cliffs, New Jersey 1989.

[3] P. P. Vaidyanathan, *Multirate Systems and Filter Banks*, Prentice Hall, Englewood Cliffs, New Jersey 1993

[4] John J. Shynk, *"Frequency-Domain and Multirate Adaptive Filtering,"* IEEE Signal Processing Magazine, January 1992.

[5] Andrew A. Gray, *"Very Large Scale Integration Architectures for Nyquist-Rate Digital Communication Receivers"*, PhD Dissertation, University of Southern California, Los Angeles, CA, May 2000

Computationally Efficient Parallel Subconvolution Filtering Architectures

Andrew A. Gray, Jet Propulsion Laboratory/CalTech

Abstact

This paper outlines novel architectures for parallel discrete-time convolution filters based on vector processing, *subconvolution*, and the discrete Fourier transform-inverse discrete Fourier transform (DFT-IDFT) overlap and save method. The motivation here is to develop simple very large scale integration (VLSI) parallel processing architectures for high order filtering/correlation so that very high rate systems can be processed with lower rate hardware, and relatively low complexity (low transistor count). The methods presented here are simple modifications to the traditional overlap and save method but provide great computational and hardware complexity reduction over many traditional approaches. While large FFT-IFFT's and zero padding are often used to perform convolution with great computational savings over traditional time-domain discrete-time convolution [1,2], implementing large FFT-IFFT pairs in hardware is often very complex in terms of both transistor count and/or design. The parallel method presented here allows relatively small DFT-IDFT pairs, while the order of the finite impulse response (FIR) filter tap length is theoretically unlimited. The size of the DFT-IDFT pair is determined by the processing rate reduction desired, not the order of the filter to be implemented

Introduction

Figure 1 illustrates a parallel DFT-IDFT filtering architecture for frequency domain filtering using the overlap and save method. The architecture in Figure 1 has 50% input vector overlap, that is $M = (L+1)/2$, the downsample rate, is equal to half the input vector length. With such an architecture a $M+1$ tap, or $M^{th}$ order FIR filter may be implemented. The filter, $h(n)$, is zero-padded to length $L+1$ and then transformed to the discrete frequency domain via the DFT, to obtain the frequency domain coefficients, $H_i=DFT\{h(n)\}$ [2]. It is obvious that any FIR filter with an order $M$ or

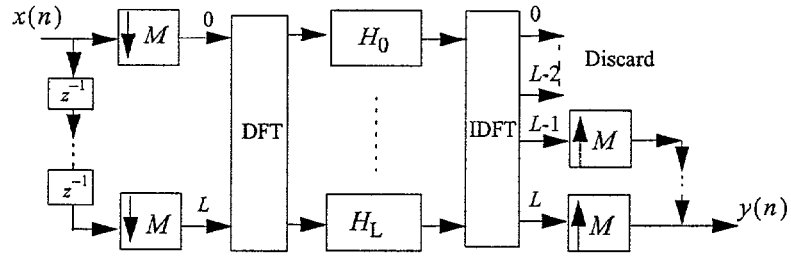

Figure 1. Frequency Domain FIR Filter Architecture less can be used with this same architecture. Similar derivations for FIR filters have been developed in [2,3,4] for implementation in software and hardware. The limitation to all of these methods is that the DFT-IDFT, or fast Fourier transform-inverse fasts Fourier transform (FFT-IFFT) lengths are increased to increase the order of the FIR filter to be implemented. To implement very large filters with such methods in VLSI application specific integrated circuits (ASICs) or field programmable gate arrays (FPGAs) becomes very complex. However, the total number of computations to perform the computation goes down as does the processing rate [4]. For a VLSI architecture in which parallel processing, or processing rate reduction, is the goal there is a simple solution to this problem. Consider the simple convolution sum of equation 1. The convolution may be broken into numerous subconvolutions, each time shifted input convolved with a *sub-filter*, as indicated.

$$y(n) = \sum_{k=0}^{N} x(n-k)h(k) = \sum_{k=0}^{j_1} x(n-k)h(k) + \sum_{k=j_1+1}^{j_2} x(n-k)h(k) + \cdots \\ \cdots + \sum_{k=j_{L-1}+1}^{j_L} x(n-k)h(k) + \sum_{k=j_L+1}^{N} x(n-k)h(k) \quad (1)$$

Each of these subconvolutions may be implemented in the frequency domain using the technique illustrated in Figure 1, then the results summed to yield the convolution output. To break a convolution up into $K$ equal length subconvolutions, each $(N+1)/K$ in length, using this method would require $K$ DFTs, $K$ IDFTs, and $K$ filter banks. Assuming 50% overlap, the DFT-IDFT pairs would each be $L = ((N+1)/K \times 2)$ in length, however there are additional simplifications with associated constraints such that any length convolution requires only one DFT-IDFT pair of this length. Such a system would have a $1/M$ processing rate reduction. We illustrate the principles with a simple example design and then generalize the results.

Example Design

We wish to design an $11^{th}$ order filter (12 coefficients) with a parallel filter bank consisting of an 8-point DFT-IDFT pair with overlap of 50% (4 sample overlap). Equation 2 indicates the subcon- $$y(n) = \sum_{k=0}^{N} x(n-k)h(k) = \sum_{k=0}^{3} x(n-k)h(k) + \sum_{k=4}^{7} x(n-k)h(k) + \sum_{k=8}^{11} x(n-k)h(k) \quad (2)$$

volutions. Each of these subconvolutions may be implemented as they were ordinary convolutions using the overlap and save method, then the results summed to generated the output of the full convolution as indicated previously. Using the following property, $x_1(n) + x_2(n) = IDFT\{DFT\{x_1(n)\} + DFT\{x_2(n)\}\}$, and the fact that each input sample vector to the DFT is a time shift of 4 from the previous input vector great simplifications are possible. We may transform the input vector, generate the subconvolution results by adding appropriate delays to the frequency domain vector (each frequency vector delay corresponds to a time delay of 4 samples) and multiplying by the appropriate frequency domain sub-filter and summing the results in the frequency domain. This *parallel subconvolution filtering architecture* (PSFA) requires only one DFT and one IDFT and is illustrated in Figure 2. Note that if a different overlap at the input is used the length of the subconvolutions must change if the summing of the subconvolution is to be performed in the frequency domain, thus requiring only one IDFT. The architec-

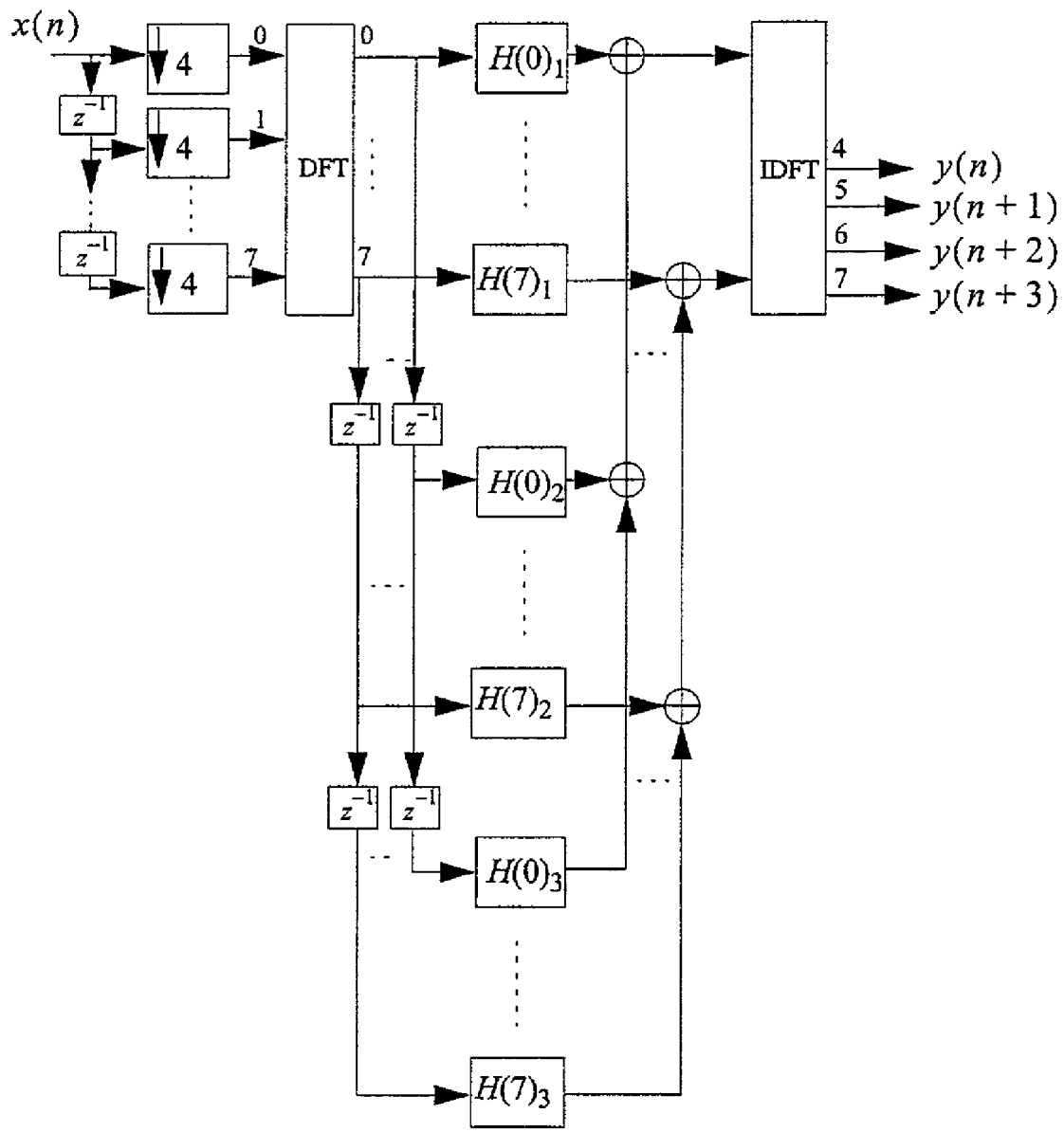
Figure 2. Parallel Subconvolver Filtering Architecture

Generalized Design

Any order FIR filter may be implemented with virtually any length FFT-IFFT pairs in the manner outlined above. This design method allows very high order filters to be implemented using relatively simple designs with less computation (and power) than traditional serial convolution.

We now provide a summary of the design rules:

1) Overlap and save method, FFT length $L+1$ and filter length $N+1$, $J = (L+1)$ - number of samples of overlap:

$$N + 1 \leq (L + 1) - J + 1 \tag{3}$$

2) If subconvolution is used there is an additional constraint. The delays in the frequency domain introduce sample time delays equal to the number of samples the input vector is sliding ($M$), this must be equal to the time (sample) delay from the beginning of one subfilter to the beginning of the next, from equation (1), $j_{i+1} - j_i = M$ for all $i$. (It should be noted that other delays may be possible in other designs. Integer delays may be introduced using phase offsets in the frequency domain, but this also changes the IDFT output pins the filtered data comes out on).

Computational Complexity

We now provide a brief comparison between traditional convolution and certain PSFA designs.

1. PSFA Design Method: When $L+1$ is the DFT/FFT length and $L + 1 = 2^v$ the number of multipliers required by the for the FFT is given by: $\mu(L + 1) = (L + 1)(v - 1)/2$ [1]. Note there are numerous types of FFT-IFFT algorithms that could be used for comparison. We choose the radix two algorithm for convenience. Assuming each filter lengths increment in $(L+1)/2$ steps the total number of multiplications required for vector output is then:

$$2\mu(L + 1) + (L + 1)\left(\frac{N+1}{\frac{L+1}{2}}\right) = 2\mu(N) + 2(M + 1) \tag{4}$$

Normalizing to multiplication per filter output this becomes, $$\frac{(2\mu(L + 1) + 2(N + 1))}{\frac{L+1}{2}} \tag{5}$$

2. Time domain convolution requires $N+1$ multiplications for each filter output.

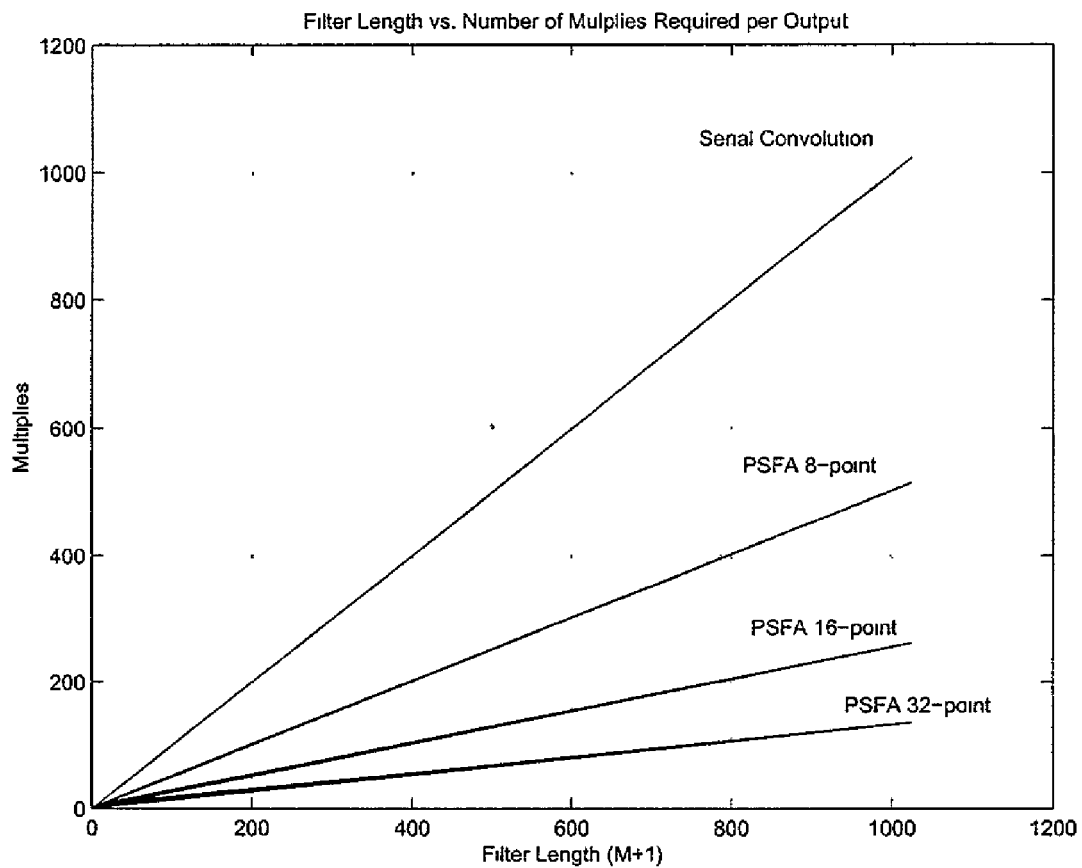
Figure 3. Multiplies Required per Output versus Filter Length ($N+1$)

Appendix C (Sheet 1 of 5)

Parallel VLSI Equalizer Architectures for Multi-Gbps Satellite Communications

Andrew A. Gray
Jet Propulsion Laboratory/CalTech
4800 Oak Grove Drive, Pasadena, CA 91109

Scott D. Hoy, Parminder Ghuman, Steve Koubek
NASA/Goddard Space Flight Center
Greenbelt Road, Greenbelt, MD 20771

*Abstract*-This paper provides an overview of a new very large scale integration (VLSI) architecture for implementing a frequency domain least-mean squares (LMS) complex equalizer [1,2]. The architecture incorporates a simple *sub-convolution* method, digital vector processing, specialized FFT-IFFT hardware architectures, and the discrete Fourier transform-inverse discrete Fourier transform (DFT-IDFT) overlap and save filter method [3]. A key property of the new architecture is that the equalizer tap length may be chosen completely independently of the FFT-IFFT lengths and input data block lengths. Theoretically unlimited tap lengths are possible with short FFT-IFFT pairs. It will be demonstrated that the new parallel architecture is very well suited for processing multi-Gbps digital communication data rates with relatively low speed CMOS hardware. The VLSI equalizer architecture presented processes complex demodulated symbols at $1/4^{th}$ the symbol rate. The parallel equalizer, operating on one sample per symbol, is 32 taps, decision directed, and will process data modulated with quadrature phase-shift keying (QPSK) and 16 quadrature amplitude modulation (QAM). The equalizer will be integrated into the 2.4 Gbps all-digital wireless parallel demodulator application specific integrated circuit (ASIC). The receiver is currently being development by JPL/CalTech and NASA's Goddard Space Flight Center. This parallel all-digital receiver designed for satellite communications operates at $1/16^{th}$ the analog-to-digital sample rate. Finally, a complexity comparison between this equalizer architecture and the traditional frequency domain fast LMS equalizer is given.

I. Introduction

The only true limitation to the data rates an all-digital receiver can process is the analog-to-digital converter. Digital receivers implemented in complementary metal oxide semiconductor (CMOS) have substantially lower clock rates than the fastest commercially available analog-to-digital converters (Ads). Therefore, CMOS digital receivers and equalizers using traditional serial algorithms for digital communications process data rates approximately 15-20 times lower than the *maximum Nyquist data rate* possible with these A/Ds. Within NASA earth science program data rates in excess of 1 Giga-bits per second (Gbps) are planned in the next 3 years, with even higher data rates to follow [4].

The research described in this publication was carried out as part of a task funded by the *Technology and Applications Program* (TAP) at the Jet Propulsion Laboratory, California Institute of Technology, under contract with the National Aeronautics and Space Administration.

Existing earth orbiting satellites support data rates of several hundred Mega-bits per second (Mbps). NASA's next-generation Telecommunication and Data Relay Satellite System (TDRSS) will support data rates up to 800 Mbps. In addition, downlink addition, numerous modulation types are available and varying data rates are required, making great flexibility in receivers necessary.

Advances in GaAs have made processing rates of several Giga-hertz (GHz) possible. However, the widespread use of high-speed GaAs components is costly in terms of both nonrecurring engineering costs and reproduction costs. It is difficult, if not impossible, to implement all of the functionality of all-digital receivers for modern satellite communications on a single GaAs application specific integrated circuit (ASIC). CMOS has much higher transistor density and typically lower nonrecurring engineering and reproduction costs than GaAs. These factors have lead NASA and JPL to developm *the all-digital parallel receiver* for processing near-maximum Nyquist data rates [5,6,7,8,9]. NASA and JPL are currently developing the next generation parallel digital receiver incorporating a parallel equalizer presented here. A high-level block diagram of the receiver is given in Figure 1.

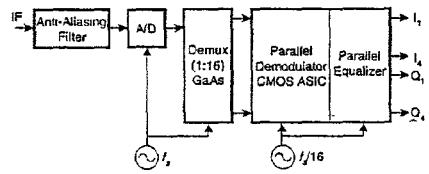

Figure 1. Parallel Digital Receiver

The objective of the parallel algorithms and architectures is to remove the limitation caused by the processing rate difference of GaAs and CMOS as illustrated in Figure 1, with the CMOS demodulator ASIC operating at $1/16^{th}$ the sample rate. The equalizer developed here requires $1/4^{th}$ rate parallel processing since it operates on one sample per symbol; the demodulator processes 4 symbols per demodulator clock cycle, or 16 samples per clock since 4 samples per symbol are assumed.

II. Parallel LMS Equalizer and Very High Rate Processing

Figure 2 illustrates a $1/4^{th}$ rate frequency domain fast LMS algorithm. This is a specific manifestation of the algorithm given by Haykin [1] and Shynk [10]. Here $x(n)$ is the sequence of the complex demodulated baseband QPSK or 16-QAM symbols, $y(n)$ is the equalizer output and $d(n)$ is the desired response created from $y(n)$ (decision directed equalizer [2,11]). We have chosen the FFT-IFFT lengths such that we may achieve the desired rate reduction for hardware implementation. However, the maximum tap length is 5 or less; the architecture in Figure 2 actually implements 4 taps. Obviously larger FFT-IFFT pairs may be used to achieve larger tap length; however, this leads to a more complex design and more transistors in a concurrent hardware implementation. The algorithm is typically more computationally efficient or "faster" than the traditional time domain approaches for many applications.

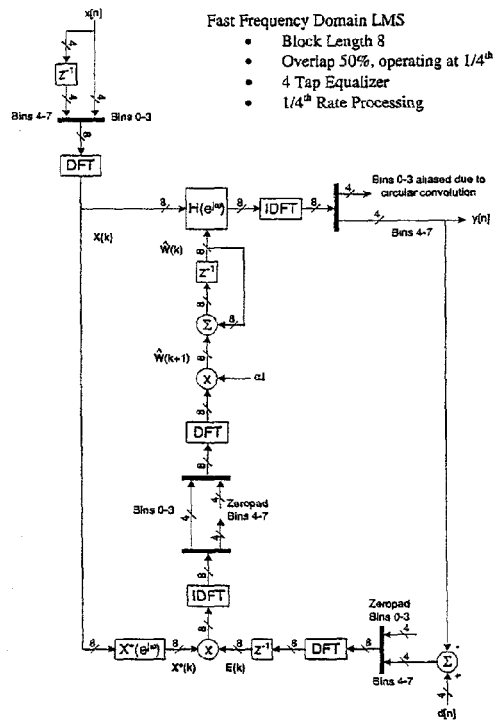

Figure 2. Frequency Domain Fast LMS [1,10]

However, if a very high rate hardware implementation of the algorithm is the goal, computational efficiency is not necessarily the primary design consideration. The architecture may be tremendously computationally efficient, but it may require so many transistors for concurrent implementation it may not be possible to implement. Alternatively, if hardware reuse is used – an extreme example of this is a pure software implementation – with maximum clock rate of $clk_{Max}$, the architecture is not capable of processing as much data as the full parallel or concurrent architecture operating at $clk_{Max}$. A hardware design employing partial concurrent or parallel operation and partial hardware reuse is often highly specialized to a specific design, is most often tedious and results in a complex design difficult to debug and test.

The new equalizer architecture developed here allows trades to be made between computational efficiency, and hardware complexity and processing rate. The trade between computational efficiency and the rate and complexity of hardware is made by eliminating the lower bound on FFT-IFFT lengths of Figure 2 created by the equalizer tap length. Through the methods developed here using *sub-convolution*, this lower bound is completely eliminated through simple and generic digital signal processing methods. The FFT-IFFT lengths may be chosen completely independently of the equalizer tap length, and in fact will be determined by the processing rate reduction desired.

The goal is to create an equalizer architecture that operates in parallel without hardware reuse for the system illustrated in Figure 1. The FFT-IFFT lengths are chosen to give the desired decrease in processing rate, in this case 4 resulting in FFT-IFFT length of 8. The system of Figure 1 has 4 samples per symbol, the demodulator operates at 1/16th the A/D rate, 1/4th the symbol rate, and the non-fractionally spaced equalizer operates at 1/4th the symbol rate [6]. The tap length of the equalizer is chosen to be 32 to meet system requirements. Traditional methods do not allow a 32-tap equalizer to be implemented with 8-point FFT-IFFT pairs. We now show this can be readily achieved with the simple *sub-convolution* method.

III. Parallel Sub-Convolution Filter Banks

Figure 3 illustrates a parallel DFT-IDFT filtering architecture for frequency domain filtering or correlation using the overlap and save method. The DFT-IDFT length is $L+1$ ($L$ is odd), and $M$, the downsample rate, is the number of samples the input window "slides". The architecture in Figure 3 has 50% input vector overlap, that is the downsample rate, is equal to half the input vector length, $M = (L+1)/2$. With such a architecture a $M+1$ tap filter may be implemented in the frequency domain.

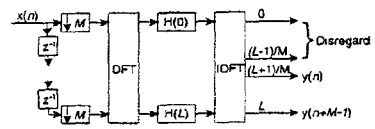

Figure 3. Overlap-and-Save FIR Filter

The filter, $h(n)$, is zero-padded to length $L+1$ and then transformed to the discrete frequency domain via the DFT, to obtain the frequency domain coefficients, $H(k)=DFT\{h(n)\}$ [3].

It is obvious that any FIR filter with an order $M$ or less can be used with this same architecture. Similar derivations for FIR filters have been developed for implementation in software and hardware. The limitation to all of these methods in a concurrent VLSI implementation is that the DFT-IDFT, or fast Fourier transform-inverse fasts Fourier transform (FFT-IFFT) lengths are increased to increase the order of the FIR filter to be implemented.

Consider the simple convolution sum of equation 1. The convolution may be broken into numerous sub-convolutions, each time shifted input convolved with a *sub-filter*, as indicated.

$$y(n) = \sum_{k=0}^{L+1} x(n-k)h(k) = \sum_{k=0}^{j_1} x(n-k)h(k) + \sum_{k=j_1+1}^{j_2} x(n-k)h(k) + \ldots + \sum_{k=j_R}^{L+1} x(n-k)h(k) \quad (1)$$

First we observe that each sample vector input to the DFT of Figure 3, and therefore the frequency domain vector, is a time delay of $M$ samples from the next sample vector input. From (1), it is obvious that each of the sums are themselves a convolution with a block of the filter or *sub-filter*, we call these *sub-convolutions* with sub-filters, the sum of their outputs is equal to the convolution of the input, $x(n)$, with the filter $h(n)$. Each of these sub-convolutions may be implemented in the frequency domain using the technique illustrated in Figure 3, then the results summed to yield the convolution output. To break a convolution up into $R$ equal length sub-convolutions, each ($L+1$) in length, using this method would require $R$ DFTs, $R$ IDFTs, and $R$ sub-filters. Assuming 50% overlap, the DFT-IDFT pairs would each be in ($L+1$) length, however simplifications requiring only one DFT-IDFT pair are possible with one additional constraint. We can derive the constraint simply by realizing that each input vector to the DFT of Figure 3 is a shift in time of $M$ samples, therefore each frequency domain vector is separated in time from the previous or next vector by $M$ sample periods. From (1), if $j_i + M = j_{i+1}$ $\forall$ $i$, that is the time delay between each sub-filter is equal to the time delay between time-consecutive input vectors, then the convolution of (1) may be calculated in the frequency domain by simply delaying the frequency domain vectors and multiplying by the appropriate frequency domain sub-filter. These sub-filters are generated as follows.

$$H_k(i) = DFT\{h_k(n)\} \quad i = 0,\ldots,L, \quad k = 1,\ldots,R$$
$$n = 0,\ldots,L \quad (2)$$

and $h_k(n)$ is the $k^{th}$ zero padded sub-filter given by:

$$h_k(n) = h(n+(k-1)M) \quad n = 0,\ldots,\frac{L-1}{2}, \quad k = 1,\ldots,R$$
$$= 0 \quad n = \frac{L+1}{2},\ldots,L, \quad k = 1,\ldots,R \quad (3)$$

Using simple properties of linearity only one DFT-IDFT pair of this length is required as all of the frequency domain sub-convolutions may be calculated then summed in the frequency domain then transformed back into the time domain. The resulting architecture is illustrated in Figure 4. This system performs convolution at a rate of $1/M$ that of the sample rate of $x(n)$. It is clear that the length of the DFT-IDFT pairs may be chosen with rate reduction as the principal design criterion independent of FIR filter length. This simple architecture then allows relatively short DFT-IDFT lengths to be used to reduce the processing rate of arbitrarily high order FIR filtering or correlation operations, yielding overall simple designs.

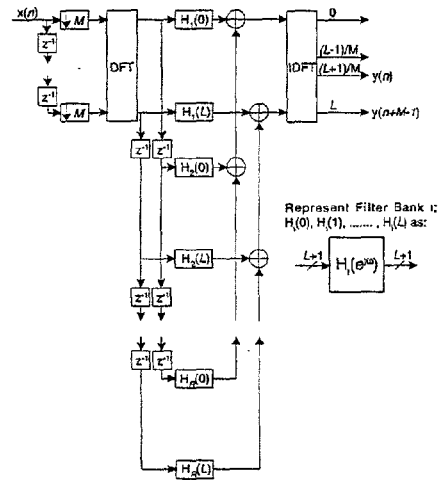

Figure 4. Parallel Sub-convolution Filter Bank Architecture

IV. Frequency Domain Fast LMS Architecture Employing Sub-Convolution and Sub-Correlation Figure 5 illustrates a new frequency domain LMS architecture employing sub-convolution and sub-correlation. The architecture is similar to a traditional frequency domain LMS with block length 32 and 16 input sample overlap implementing 16 equalizer taps. However, in this architecture only 8-point FFT-IFFT pairs are required and it is extendable to 32 (or larger) tap length.

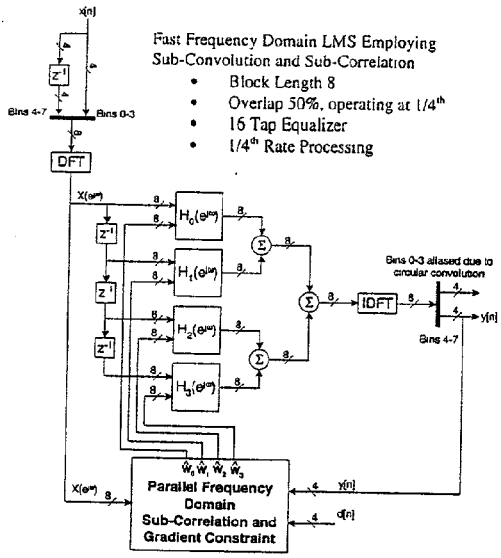

Figure 5. Parallel Frequency Domain Fast LMS Architecture Employing Sub-Convolution and Sub-Correlation Assuming constant $\alpha$ for all frequency bins, the architecture of Figure 5 performs the same as the traditional fast frequency domain LMS with block length 32 (32-point FFT-IFFTs) with 50% input block overlap, and 16 taps. Obviously in the 32-point FFT-IFFT case, if a frequency dependent step size $\alpha$ is desired, there is more frequency resolution possible. All the mathematical operations of the 32-point fast LMS equalizer employing 32-Point FFT-IFFTs; as in Figure 2 with modifications such as 32 sample block inputs sliding 16 samples per clock and 32-point FFT-IFFTs, are performed in the new architecture illustrated in Figures 5 and 6. The convolution and correlation operations of the fast LMS have been replaced by sub-convolution and sub-correlation. There are other minor modifications that follow directly from linear systems theory. Figure 7 illustrates the function of the vector downsampler used throughout the architectures in Figures 5 and 6. The architecture of Figures 5 and 6 may be extended to arbitrarily long tap lengths, while still using 8-point FFT-IFFT pairs for the 1/4$^{th}$ processing rate reduction.

It should be noted that we have shown the frequency domain taps of Figure 5 to be updated every 4 system clock cycles; this corresponds to 16 time domain sample periods ($T_s$). There may be advantages to updating more often, particularly with a very large number of taps. In the sub-convolution/sub-correlation architecture it is possible to update the taps more often than the traditional fast LMS frequency domain equalizer using an equivalent number of taps.

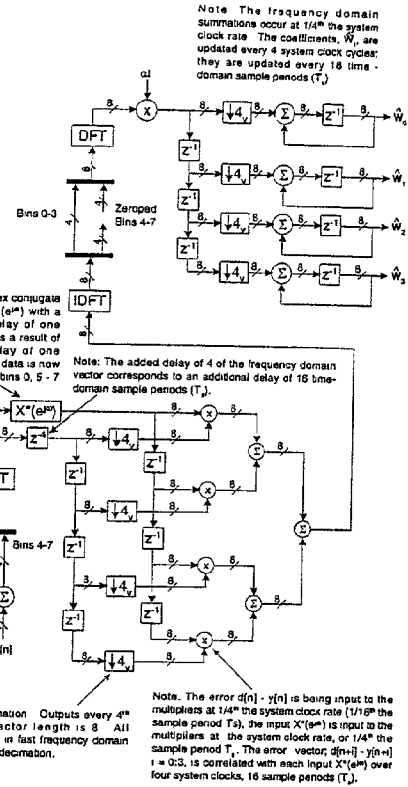

Figure 6. Parallel Frequency Domain Sub-Correlation and Gradient Constraint

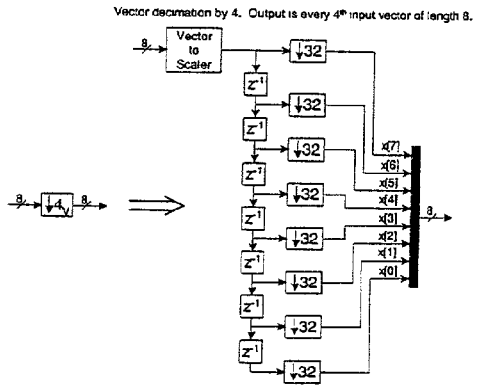

Figure 7. Length-8 Vector Downsample by 4

V. Complexity Comparison

Here we use the number of complex multiplies as the basis for complexity comparison of the fast frequency domain LMS, time-domain block LMS, and fast LMS employing sub-correlation and sub-convolution. Further we assume a 16-tap equalizer and that the input $x(n)$, and filter taps, $h(n)$, are complex. When $M$ is the DFT-IDFT length and $M = 2(L+1) = 2^\nu$, the number of multipliers required by the FFT is given by $\mu(M) = \frac{M(\nu-1)}{2}$ [3]. Note that there are numerous types of FFT-IFFT algorithms that could be used for comparison. We choose the radix two algorithm for convenience. From [1] the number of complex multiplies required by the block time-domain LMS is $2(L+1)^2$. The number of complex multiplies per equalizer output sample is then:

$$\frac{2(L+1)^2}{L+1} = \frac{2(16)^2}{16} = 32. \qquad (4)$$

The number of complex multiplications per equalizer output of the fast 32-point ($M=32$) frequency domain LMS is then:

$$\frac{\frac{5M(\nu-1)}{2}+2M}{L+1} = \frac{\frac{5(32\times 4)}{2}+2\times 32}{16} = 24. \qquad (5)$$

The number of complex multiplications per equalizer output of the 8-point ($M=8$) frequency domain LMS employing sub-convolution and sub-correlation is then:

$$\frac{\frac{5M(\nu-1)}{2}+2\times(4\times M)}{M/2} = \frac{5\times 8+2\times 4\times 8}{4} = 26. \qquad (6)$$

Figure 8 is a plot of the approximate number of multipliers required to implement the three 16-tap architectures without hardware reuse. The fast LMS and block time-domain algorithms operate at $1/16^{th}$ the input sample rate while the fast LMS using sub-convolution/correlation operates at $1/4^{th}$ the input sample rate.

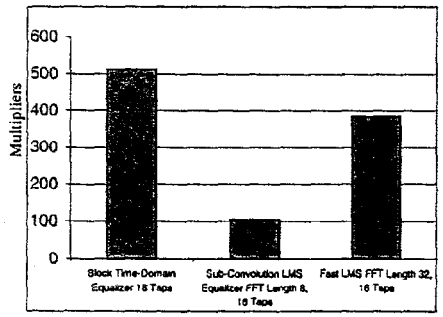

Figure 8. Number of Hardware Multiplies for Concurrent Implementation

VI. Conclusion

We have presented a new fast LMS frequency domain equalizer architecture. The new architecture employs simple design techniques for designing parallel filter bank architectures based on the concept of separating a convolution into what we call sub-convolutions. These techniques allow arbitrarily long convolution or correlation to be performed using the overlap-and-save method with virtually any FFT-IFFT length. We have shown that the lower bound on FFT-IFFT lengths in the fast LMS algorithms created by tap length is removed using sub-convolution and sub-correlation techniques.

The non-fractionally spaced equalizer architecture presented operates at $1/4^{th}$ the input symbol rate, uses 8-point FFT-IFFTs, and 16 taps and extendable to higher tap lengths. Finally, the computation reduction over the serial implementation of time-domain block equalizer was demonstrated and the low complexity VLSI architecture was contrasted to the traditional frequency domain LMS equalizer whose FFT-IFFT lengths have traditionally been determined by tap length in concurrent hardware implementations. It was demonstrated with the architecture currently being developed, that the sub-convolution filter bank design technique is very useful for making tradeoffs between design complexity, computationally efficiency, and processing rate.

References

[1] S. Haykin, *Adaptive Filter Theory*, Prentice Hall, Upper Saddle River, New Jersey 07458

[2] John Proakis, *Digital Communications*, McGraw-Hill, Inc. New York, 1995.

[3] A.V. Oppenheim, R. W. Schafer, *Discrete-Time Signal Processing*, Premtice-Hall, Englewood Cliffs, New Jersey 1989.

[4] W. Schober, F. Lansing, K. Wilson: JPL, E. Webb: NASA/GSFC, *"NASA High Rate Instrument Study,"* National Aeronautics and Space Administration, Jet Propulsion Laboratory, JPL Publication 99-4, Jan., 1999

[5] R. Sadr, P.P. Vaidyanathan, D. Raphaeli, S. Hinedi, *"Parallel Digital Modem Using Multirate Filter Banks,"* JPL Publication 94-20, Jet Propulsion Laboratory, Pasadena, CA, August 1994.

[6] Andrew A. Gray, *"Very Large Scale Integration Architectures for Nyquist-Rate Digital Communication Receivers"*, PhD Dissertation, University of Southern California, Los Angeles, CA, May 2000

[7] Gerald Grebowsk, Andrew A. Gray, Meera Srinivasan, "Method and Apparatus for High Data Rate Demodulation", US Patent 6,177,835, Jan. 23, 2001

[8] Andrew A. Gray, Meera Srinivasan, Marvin Simon, Tsun-Yee Yan, *"Flexible All-Digital Receiver for Bandwidth Efficient Modulation"*, Int. Telemetry Conference, Nov. 1999

[9] Meera Srinivasan, Chien-Chung Chen (JPL/Caltech), Andrew A. Gray, Gerry Grebowsky (NASA/GSFC), *"All-Digital High Data Rate Parallel Receiver,"* International Conference on Signal Processing Applications and Technology, Sept., 1998.

[10] John J. Shynk, *"Frequency-Domain and Multirate Adaptive Filtering,"* IEEE Signal Processing Magazine, January 1992.

[11] Theodore Rappaport, *Wireless Communications*, PTR Prentice Hall, Englewood Cliffs, NJ, 1996.

Appendix D (Sheet 1 of 6)

Parallel *Sub-Convolution* Filter Bank Architectures

Andrew A. Gray

Jet Propulsion Laboratory, California Institute of Technology
4800 Oak Grove Drive Pasadena, CA 91101

*Abstract*-This paper provides an overview of the design and properties of parallel discrete-time filter bank architectures based on the concept of *sub-convolution*. We demonstrate this filter bank method is an excellent choice for implementing many signal processing functions for high rate or low power communications systems. These filter bank architectures incorporate vector processing, the discrete Fourier transform-inverse discrete Fourier transform (DFT-IDFT) overlap and save convolution method [1], and a simple sub-convolution method. The parallel processing architectures presented here allow for processing very high rate sampled systems (multi-giga-samples per second) with lower rate complementary metal oxide semiconductor (CMOS) hardware, and relatively low complexity (low transistor count). Complexity comparisons will demonstrate that the sub-convolution filter bank results in less complex concurrent implementations than parallel time-domain convolution and conventional frequency-domain convolution methods for many processing rate reductions and filter orders. In addition, the sub-convolution filter bank may be used to provide intermediate computation gain, with computation requirements lying in between those of these two conventional methods. Finally, an example will be given of a parallel adaptive LMS equalizer employing frequency domain sub-convolution and sub-correlation.

I. Introduction

Figure 1 illustrates a parallel DFT-IDFT filtering architecture for frequency domain filtering using the overlap and save method. The DFT-IDFT length is $L+1$ ($L$ is odd), and $M$, the downsample rate, is the number of samples the input window "slides". The architecture in Figure 1 has 50% input vector overlap, that is the downsample rate, is equal to half the input vector length, $M = (L+1)/2$.

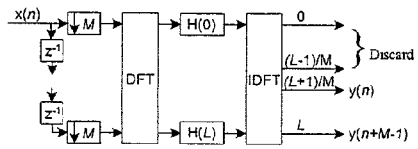

Figure 1. Overlap-and-Save FIR Filter

The research described in this publication was carried out as part of a task funded by the *Technology and Applications Program* (TAP) at the Jet Propulsion Laboratory, California Institute of Technology, under contract with the National Aeronautics and Space Administrations With such an architecture a $M+1$ coefficient filter may be implemented in the frequency domain. The filter, $h(n)$, is zero-padded to length $L+1$ and then transformed to the discrete frequency domain via the DFT, to obtain the frequency domain coefficients, $H(k)=\text{DFT}\{h(n)\}$ [2]. It is obvious that any FIR filter with an order $M$ or less can be used with this same architecture. Similar derivations for FIR filters have been developed in [2,3,4] for implementation in software and hardware. The limitation to all of these methods is that the DFT-IDFT, or fast Fourier transform-inverse fasts Fourier transform (FFT-IFFT) lengths are increased to increase the order of the FIR filter to be implemented. To implement very large filters with such methods in VLSI application specific integrated circuits (ASICs) or field programmable gate arrays (FPGAs) becomes very complex. However, the total number of computations to perform the convolution decreases and the processing rate may decrease as well. Alternative approaches include subband convolution, using analysis and synthesis filter banks, subband convolution may be used to implement arbitrarily long FIR filters [3]. However, due to the complexity of their hardware implementations more simple approaches are desirable. For a VLSI architecture in which parallel processing or processing rate reduction is the goal there is a simple solution to this problem presented here.

II. Parallel Sub-convolution Filter Banks

Consider the simple convolution sum of equation 1. The convolution may be broken into numerous sub-convolutions, each time shifted input convolved with a *sub-filter*, as indicated.

$$y(n) = \sum_{k=0}^{N-1} x(n-k)h(k) = \sum_{k=0}^{j_1} x(n-k)h(k) + \sum_{k=j_1+1}^{j_2} x(n-k)h(k) + \ldots + \sum_{k=j_R}^{N-1} x(n-k)h(k) \quad (1)$$

First we observe that each sample vector input to the DFT of Figure 1, and therefore the frequency domain vector, is a time delay of $M$ samples from the next sample vector input. From (1), it is obvious that each of the sums are themselves a convolution with a block of the filter or *sub-filter*, we call these *sub-convolutions* with sub-filters, the sum of their outputs is equal to the convolution of the input, $x(n)$, with the filter $h(n)$. Each of these sub-convolutions may be implemented in the frequency domain using the technique illustrated in Figure 1, then the results summed to yield the convolution output. To break a convolution up into $R$ equal length sub-convolutions, each $(L+1)$ in length, using this method would require $R$ DFTs, $R$ IDFTs, and $R$ filter banks. Assuming 50% overlap, the DFT-IDFT pairs would each be in $(L+1)$ length, however simplifications requiring only one DFT-IDFT pair are possible with one additional constraint. We can derive the constraint simply by realizing that each input vector to the DFT of Figure 1 is a shift in time of $M$ samples, therefore each frequency domain vector is separated in time from the previous or next vector by $M$ sample periods. From (1), if $j_i + M = j_{i+1} \; \forall \; i$, that is the time delay between each sub-filter is equal to the time delay between time-consecutive input vectors, then the convolution of (1) may be calculated in the frequency domain by simply delaying the frequency domain vectors and multiplying by the appropriate frequency domain sub-filter. These sub-filters are generated as follows.

$$H_k(i) = DFT\{h_k(n)\} \quad i = 0,...,L, \; k = 1,...,R$$
$$n = 0,...,L \quad (2)$$

and $h_k(n)$ is the $k^{th}$ zero padded sub-filter given by:

$$h_k(n) = h(n + (k-1)M) \quad n = 0,...,\frac{L-1}{2}, \; k = 1,...,R$$
$$= 0 \quad n = \frac{L+1}{2},...,L, \; k = 1,...,R \quad (3)$$

Using simple properties of linearity only one DFT-IDFT pair of this length is required as all of the frequency domain sub-convolutions may be calculated then summed in the frequency domain then transformed back into the time domain. The resulting architecture is illustrated in Figure 2. This system performs convolution at a rate of $1/M$ that of the sample rate. It is clear that the length of the DFT-IDFT pairs may be chosen with rate reduction as the principal design criterion independent of FIR filter length. This simple architecture then allows relatively short DFT-IDFT lengths to be used to reduce the processing rate of high order FIR filtering or correlation operations, yielding overall simple designs. Rate reductions of between 8 and 16 are extremely useful as this is approximately the difference between the clock rates of the fastest high rate digital-to-analog converters and those of commercial CMOS processors [5].

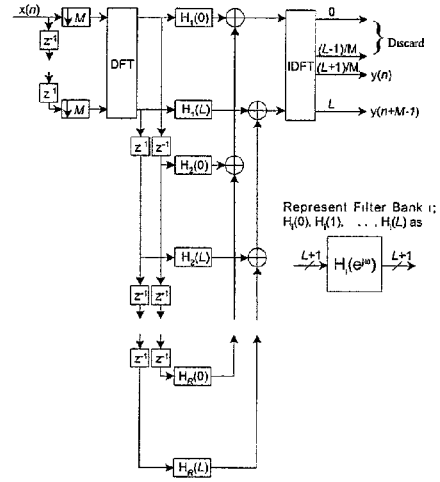

Figure 2. Parallel Sub-convolution Filter Bank Architecture

III. Complexity Comparisons

Here we wish to compare the number of complex multiplies required for a parallel hardware implementation of the frequency domain sub-convolution method, frequency domain overlap-and-save method, and time-domain parallel method [5] for various processing rate reductions $M$. This comparison is the primary metric for determining the appropriate architecture for concurrent VLSI hardware implementation where the goal is to maximize operations per second while minimizing hardware required for a given maximum clock rate. However, we will also compare the computational efficiency, measured as the number of multiples per filtered output, of the sub-convolution method, conventional convolution, and frequency domain overlap-and-save convolution. This comparison is valuable when the goal is to maximize filter output rate where a full-parallel architecture is not possible and hardware reuse is employed. The extreme example of hardware reuse is an implementation in a microprocessor (software implementation) where perhaps one hardware multiplier is used for all multiplications required in a filtering architecture. This metric is also useful for determining the appropriate architecture to minimize power consumed in a CMOS hardware implementation.

III.A Complexity of Parallel Hardware Implementation

We use the number of complex multiplies as the basis for complexity comparison. Further we assume the input $x(n)$, and filter coefficients, $h(n)$, are complex. When $L+1$ is the FFT-IFFT length and $L+1 = 2^v$, the number of multipliers required by the FFT is given by $\mu(L+1) = \frac{(L+1)(v-1)}{2}$ [1]. Note that there are numerous types of FFT-IFFT algorithms that could be used for comparison. We choose the radix two algorithm for convenience. The amount of overlap is determined to minimize multiplier count for a given processing rate reduction. The maximum number of coefficients (constrained that they be a power of 2) that can be implemented in the architecture of Figure 1 is $N = ((L+1) - M)$. Without this constraint the total number of coefficients is one more; $N = ((L+1) - M + 1)$. The FFT-IFFT lengths as a function of rate reduction $M$ and filter length $N$ is then $(L+1) = N + M$. The multipliers required for the frequency domain filtering of Figure 1 is given by:

$$2\mu(L+1) + (L+1) = (L+1)(v-1) + (L+1) =$$
$$(N+M)(\log_2(N+M) - 1) + (N+M) = \quad (4)$$
$$(N+M)(\log_2(N+M)).$$

For the parallel sub-convolution filter bank method we set the FFT-IFFT lengths to be twice the rate reduction (yielding the most computationally efficient 50% overlap [4]), that is $(L+1)=2M$. We further assume each filter length increment is an integer multiple of $(L+1)/2$. The number of frequency domain multiples for each sub-filter of length $M$ is $2M$ and there are $R=N/M$ filter banks. The total number of multipliers required for the filtered vector output of the PSFB in Figure 2 is then $$2\mu(2M) + (2M)R = 2M(\log_2(2M) - 1) + 2N. \quad (5)$$

The multiplies required by parallel time-domain convolution is given by [5]:
$$MN \quad (6)$$

For a parallel (concurrent) VLSI implementation, we wish to determined for what values of $M$ and $N$ the PSFB is least hardware. First we wish find to for which values of $M$ and $N$ (5) is less than (6); that is $2M(\log_2(2M)-1) + 2N < MN$. This simplifies to $M^{2M/(M-2)} < 2^N$, and finally to $$\left(2 / \left(1 - \frac{2}{M}\right)\right) \log_2(M) < N. \quad (7)$$

The inequality of (7) holds for processing rate reduction of $1/4^{th}$ or less ($M$ great than or equal to 4) for all filters with greater than 8 coefficients ($N > 8$). Figures 3.a-c illustrates the multiplier savings for several values of $M$ and $N$, where TC indicates parallel time-domain convolution and parallel sub-convolution filter banks are represented by PSFB.

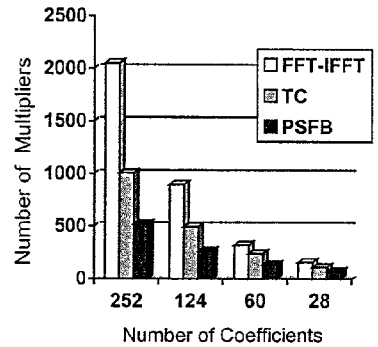

Figure 3.a. $1/4^{th}$ Rate Processing Architectures ($M$=4)

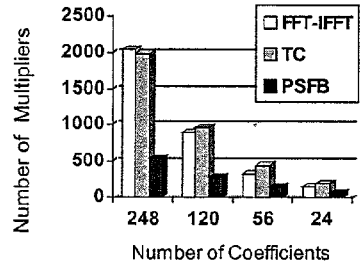

Figure 3.b. $1/8^{th}$ Rate Processing Architectures ($M$=8)

Appendix D (Sheet 4 of 6)

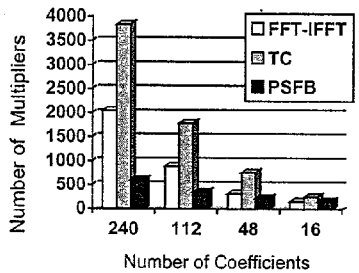

Figure 3.c. 1/16$^{th}$ Rate Processing Architectures ($M$=16)

Now we determine for what values of $M$ and $N$ (5) is less than (4); that is:

$$2M(\log_2(2M)-1)+2N < (M+N)(\log_2(N+M)). \quad (8)$$

Letting $N=M+K$ where $K$ is some integer and substituting in (8) we obtain $$2M\log_2(2M) - 2M + 2(M+K) < (2M+K)\log_2(2M+K)$$
$$2M\log_2(2M) + 2K < (2M+K)\log_2(2M+K)$$
$$2M\log_2(2M) + 2K < 2M\log_2(2M+K) + K(\log_2(2M+K)). \quad (9)$$

Now it is clear that for any value of $M$ and all $K \geq 0$ $$2M\log_2(2M) < 2M\log_2(2M+K). \quad (10)$$

Given this constraint what values of $M$ and $K$ yield $$2K < K\log_2(2M+K)? \quad (11)$$

This inequality is true when $M \geq 2$ and $K \geq 1$, that is $N > M$. Summarizing, the inequality of (8) holds for processing rate reduction of 1/2 or less, $M$ great than or equal to 2, and for all filters with the number of coefficients $N$ greater than $M$, $N=M+K>3$. Figures 3.a-c illustrates the multiplier savings for several values of $N$ and $M$, where FFT-IFFT indicates parallel frequency domain convolution and parallel sub-convolution filter banks are represented by PSFB.

III.B Computational Complexity of Filtering Implementations

Generally the overlap-and-save method of convolution using 50% overlap is the most computationally efficient, measured as number of multiplies per filtered output, method of the methods considered here [6]. In an implementation employing hardware reuse, such as a software implementation, the FFT-IFFT length can be determined from the filter length to minimize the number of multiplies per filtered output. The PSFB may be used to provide intermediate computation gain, between that of the overlap-and-save method and conventional convolution. The number of complex multiplies per filtered output in the PSFB is $$\frac{2M(\log_2(2M)-1)+2N}{M} \quad (12)$$

For conventional convolution obviously the number of multiplies per filtered output is $N$. The PSFB design method provides intermediate computation gain when the following inequality holds:

$$\frac{2M(\log_2(2M)-1)+2N}{M} < N$$
$$2(\log_2(2M)-1) < N\left(1-\frac{2}{M}\right) \quad (13)$$
$$2\log_2(M) < N\left(1-\frac{2}{M}\right)$$
$$\frac{2M}{M-2}\log_2(M) < N.$$

Figure 4 is a plot of the number of multiplies required per filter output for traditional serial convolution, and four different parallel sub-convolution filter banks (PSFB). The four FFT-IFFT lengths are $L+1=8$, 16, 32, and 64 (Figure 2). We denote these four architectures PSFB(8), PSFB(16), PSFB(32), and PSFB(64) respectively.

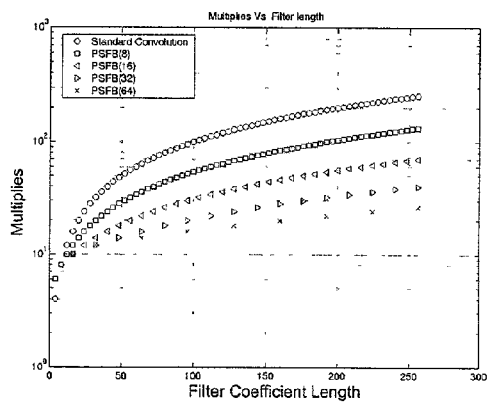

Figure 4. Computation Comparison

It is evident in Figure 4 that a reduction in the number of multiplies per filtered output sample is a possible result for parallel sub-convolution filter banks. The sub-convolution filter bank may be a useful design technique for low power CMOS applications.

IV. Frequency Domain Fast LMS Architecture Employing Sub-Convolution and Sub-Correlation The equalizer architecture presented here is an extension of the fast LMS algorithm [6] and utilizes parallel sub-convolution filter banks. These filter banks allow trades to be made between computational efficiency, and hardware complexity and processing rate by eliminating the lower bound on FFT-IFFT lengths created by the equalizer coefficient length. Through the methods developed here using sub-convolution, this lower bound is completely eliminated; the FFT-IFFT lengths may be chosen completely independently of the equalizer coefficient length, and in fact will be determined by the processing rate reduction desired.

The processing rate reduction is chosen to be 4, resulting in FFT-IFFT lengths of 8. The equalizer is chosen to have 16 coefficients. Traditional methods do not allow a 16-coefficient equalizer to be implemented with 8-point FFT-IFFT pairs. Figure 5 illustrates a frequency domain LMS architecture employing sub-convolution and sub-correlation and is described in detail in [7]. The architecture performs identically to a traditional frequency domain LMS with block length 32 and 16 input sample overlap implementing 16 equalizer coefficients. However, in this architecture only 8-point FFT-IFFT pairs are required and it is extendable to larger coefficient lengths.

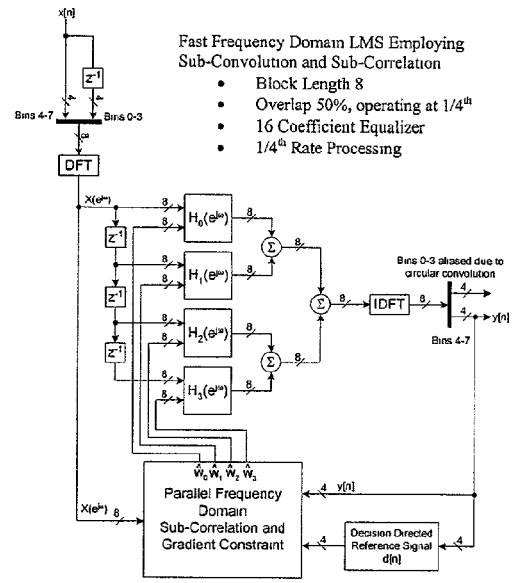

Figure 5. Parallel Frequency Domain Fast LMS Architecture Employing Sub-Convolution and Sub-Correlation Assuming constant frequency weight $\alpha$ for all frequency bins, the architecture of Figure 5 performs the same as the traditional fast frequency domain LMS with block length 32 (32-point FFT-IFFTs) with 50% input block overlap, and 16 coefficients. Obviously in the 32-point FFT-IFFT case, if a frequency dependent weight is desired, there is more frequency resolution possible. The convolution and correlation operations of the fast LMS have been replaced by sub-convolution and sub-correlation. The architecture of Figure 5 may be extended to arbitrarily long tap lengths, while still using 8-point FFT-IFFT pairs for the $1/4^{th}$ processing rate reduction. Although not analyzed here, note that the tap update rate can be made faster than the traditional fast LMS equalizer.

V. Conclusion

We have presented a simple design technique for designing parallel frequency domain filter bank architectures based on the concept of separating a convolution into what we call sub-convolutions and deriving sub-filters for each bank from the filter to be implemented. These methods are then combined with overlap-and-save convolution techniques to create the parallel frequency-domain filter bank. The rate reduction of the filter, and hence the FFT-IFFT length, is determined by the desired rate reduction and is independent of the FIR filter length to be implemented. A complexity and computation comparison between the parallel sub-convolution method and conventional methods was made. Significant complexity reduction over time-domain convolution and conventional overlap-and-save frequency domain convolution was demonstrated for certain classes of parallel filters. The design method may be used to provide intermediate computation gain, with computation requirements between those of time-domain convolution and the traditional all-frequency domain convolution. Finally an example parallel adaptive equalizer design was presented using the parallel sub-convolution/correlation filter bank architecture.

VI. References

[1] A.V. Oppenheim, R. W. Schafer, *Discrete-Time Signal Processing*, Premtice-Hall, Englewood Cliffs, N.J. 1989.

[2] P. P. Vaidyanathan, *Multirate Systems and Filter Banks*, Printice Hall, Englewood Cliffs, New Jersey 1993

[3] R. Sadr, P. P. Vaidyanathan, D. Raphaeli, S. Hinedi, "Multirate Digital Modem Using Multirate Digital Filter Banks", JPL Publication 94-20, August 1994.

[4] J. Shynk, *"Frequency-Domain and Multirate Adaptive Filtering,"* IEEE Signal Processing Magazine, Jan. 1992.

[5] Andrew A. Gray, *"Very Large Scale Integration Architectures for Nyquist-Rate Digital Communication Receivers"*, PhD Dissertation, University of Southern California, Los Angeles, CA, May 2000

[6] Simon Haykin, *Adaptive Filter Theory*, Prentice Hall, Upper Saddle River, New Jersey, 1996

[7] A. Gray, S. Hoy, P. Ghuman, *"Parallel VLSI Architectures for Multi-Gbps Satellite Communicaitons"* IEEE GlobeComm, November, 2001

I claim:

1. A method of filtering a data signal having a data rate M comprising:
   providing said data signal to a first downsampler;
   coupling the output of said downsampler to a DFT for converting said input signal to k frequency domain vectors, providing said DFT output to a plurality of sub filters Hj where j{1,k} and for each subfilter said DFT output is delayed by j-1;
   multiplying said k frequency domain vectors with k subfilter coefficients to generate k frequency domain filtered signals;
   summing said k frequency domain filtered signals and inputting said summed signals to an IDFT; and
   converting said frequency domain filtered signal to a time domain filtered signal using said IDFT.

2. The method of claim 1, further including using N downsamplers DN, N comprising an integer greater than 0, and for each downsampler the input signal is delayed by N-1.

* * * * *

UNITED STATES PATENT AND TRADEMARK OFFICE
CERTIFICATE OF CORRECTION

| | | |
|---|---|---|
| PATENT NO. | : 7,290,021 B2 | Page 1 of 1 |
| APPLICATION NO. | : 10/132085 | |
| DATED | : October 30, 2007 | |
| INVENTOR(S) | : Andrew Gray | |

It is certified that error appears in the above-identified patent and that said Letters Patent is hereby corrected as shown below:

IN COLUMN 1, BEFORE THE HEADING BACKGROUND OF THE INVENTION, THE FOLLOWING HEADING AND TEXT WAS OMITTED:

--STATEMENT REGARDING FEDERALLY SPONSORED RESEARCH OR DEVELOPMENT

The invention described herein was made in the performance of work under a NASA contract, and is subject to the provisions of Public Law 96-517 (35 U.S.C. 202) in which the Contractor has elected to retain title.--

Signed and Sealed this

First Day of April, 2008

JON W. DUDAS
*Director of the United States Patent and Trademark Office*